United States Patent
Takeuchi et al.

(10) Patent No.: US 8,635,511 B2
(45) Date of Patent: Jan. 21, 2014

(54) DATA PROCESSING APPARATUS, CONTROL DEVICE AND DATA STORAGE DEVICE

(75) Inventors: Ken Takeuchi, Tokyo (JP); Mayumi Fukuda, Tokyo (JP)

(73) Assignee: The University of Tokyo, Tokyo (JP)

( * ) Notice: Subject to any disclaimer, the term of this patent is extended or adjusted under 35 U.S.C. 154(b) by 131 days.

(21) Appl. No.: 13/205,239

(22) Filed: Aug. 8, 2011

(65) Prior Publication Data

US 2012/0072801 A1   Mar. 22, 2012

(30) Foreign Application Priority Data

Aug. 11, 2010 (JP) ................................. 2010-180087

(51) Int. Cl.
*G11C 29/00* (2006.01)
(52) U.S. Cl.
USPC ............................ 714/763; 713/759; 713/785
(58) Field of Classification Search
USPC ......... 714/763, 759, 746, 785, 766, 755, 758, 714/720
See application file for complete search history.

(56) References Cited

U.S. PATENT DOCUMENTS

| | | | |
|---|---|---|---|
| 6,941,505 B2 * | 9/2005 | Yada et al. | 714/763 |
| 7,447,932 B2 * | 11/2008 | Ichien et al. | 713/400 |
| 8,019,929 B2 * | 9/2011 | Kimura | 711/103 |
| 8,316,280 B2 * | 11/2012 | Chang et al. | 714/769 |

OTHER PUBLICATIONS

Takashima et al., "A 128Mb ChainFeRAM™ and System Designs for HDD Application and Enhanced HDD Performance," *IEEE Asian Solid-State Circuits Conference*, Nov. 16-18, 2009, Taipei, Taiwan, pp. 13-16.

\* cited by examiner

*Primary Examiner* — Fritz Alphonse
(74) *Attorney, Agent, or Firm* — Oliff & Berridge, PLC

(57) ABSTRACT

When write data D is high rewritten data, a PC 10 controls a DRAM 24 to store the write data D (steps S100 and S110). When the write data D is not the high rewritten data, the PC 10 outputs an RRAM write request signal and the write data D to an SSD (step S100 and S120). A memory controller of the SSD input the RRAM write request signal controls the RRAM and an SRAM to store the write data D in the RRAM or the SRAM. This treatment enables data stored in the DRAM to be rewritten frequently. Therefore, the decrease of number of times of refresh operation of the DRAM and the decrease of power consumption are accomplished.

31 Claims, 12 Drawing Sheets

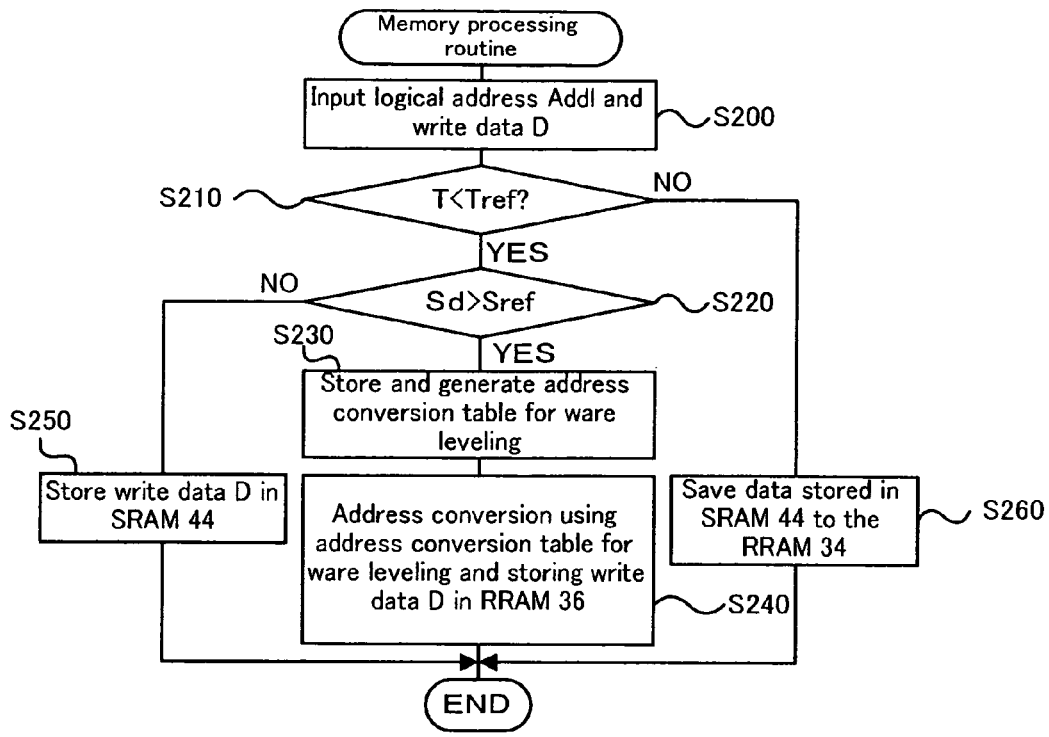
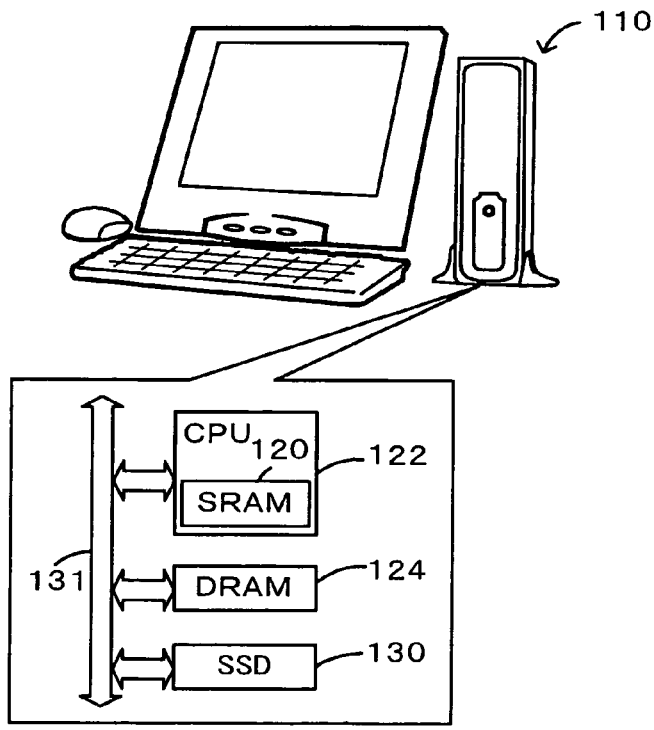

| Number of failure being able to be porformed error correction using ECC | Maximum value of rewrite times untill product life end | Number of rewrite times untill now | Total number of bits being able to be rewritten untill product life end | Total number of bits rewritten untill now |
|---|---|---|---|---|

DATA PROCESSING APPARATUS, CONTROL DEVICE AND DATA STORAGE DEVICE

BACKGROUND OF THE INVENTION

1. Field of the Invention

The present invention relates to a data processing apparatus, a control device and a data storage device.

2. Description of the Prior Art

One proposed structure of a control device controls a FeRAM (Ferroelectric Random Access Memory) as a cache memory or HDD to store data from a PC system (see, for example, Non-Patent Document 1). In the structure, the FeRAM is configured as a nonvolatile random access memory maintaining data stored therein when a power supply is stopped. In this device, data in the FeRAM is not regularly needed to be evacuated to HDD in preparation to an unexpected stop power supply. This arrangement enables to increase amount of data stored to FeRAM, and to increase cache hit ratio.

Non-patent document 1: Daisaburo Takahashi et al. "A 128 Mb ChainFeRAMTM and System Designs for HDD Application and Enhanced HDD Performance", IEEE Asian Solid-State Circuits Conference, Nov. 16-18, 2009, Taipei, Taiwan.

In this prior art data processing apparatus, code length of error correcting code is set predetermined length, and error correction of data is performed using error correcting code having the predetermined length. There is an upper limit in number of bits that is correctable. When the errors more than the upper limit of number of bits that is correctable occurs, this errors cannot be corrected. One method for correcting more error is to use error correcting code having longer code length. In this case, the time for encoding or decoding data in the error correction circuit increases, and consumption power of the error correction circuit increases.

SUMMARY OF THE INVENTION

In data processing apparatus controlling DRAM (Dynamic Random Access Memory) as a main memory to store data performed arithmetic processing by CPU (Central Processing Unit), refresh operation periodically reading out data from the DRAM and rewriting the read data in the DRAM is needed to be performed to maintain data stored in the DRAM. The more the number of times of this refresh operation is, the more power consumption is. It is desired to decrease the power consumption by decreasing the number of times of this refresh operation. One method for decreasing the power consumption is to use a nonvolatile RAM (Random Access Memory) required no refresh operation instead of the DRAM as the main memory. In general, the more the number of rewrite times of a nonvolatile RAM is, the more the nonvolatile RAM is deteriorated. Frequent rewrite in data in the nonvolatile RAM causes data stored in the nonvolatile RAM a lot of errors.

In stopping system, the data processing apparatus described above executes control process evacuating data stored in register incorporated in the CPU or data stored in SRAM (Static Random Access Memory) as a cache memory to the DRAM and decreasing the power consumption by stopping power supply from external power supply to the CPU. However, the power supply to the DRAM is needed to be continued to maintain data stored in the DRAM in stopping the system. Therefore, sufficient decrease of the power consumption is not accomplished.

In a storage device having a nonvolatile storage device such as HDD etc. and a nonvolatile RAM as a cache memory, the more number of rewrite times is, the more deteriorated memory cells configuring a nonvolatile RAM are and the higher possibility of occurrence of data errors is. It is considered that suppressing error in the nonvolatile RAM is one of important problems. One method for suppressing errors in nonvolatile RAM is performing ware leveling. The ware leveling is method of leveling number of rewrite times per one memory cell. In a random access memory such as a nonvolatile RAM, it is assumed that data having small size is read and written comparative frequently. Getting smaller size of write data causes size of data storage area needed to be stored an address conversion table for converting a logical address into a physical address in ware leveling to be longer. Another method for suppressing error in the nonvolatile RAM is to perform error correction to data using error correcting code (ECC). However, the time for encoding or decoding data increases by ECC when data having small size is read and written comparative frequently. It is not preferable to increase the size of the memory area for the address conversion table and to increase the time for ECC in view of speeding up. Therefore, it is desired to suppress the increase of the size of the memory area for the address conversion table and the increase of time for ECC.

In a data processing apparatus reading out program stored in a nonvolatile memory and performing data processing based on the read program, using a NOR type flash memory having comparative high speed in reading out data enables readout speed in reading out the program to be high. However, larger increase in read out speed is desired.

In a data processing apparatus of the present invention, there would thus be demand for decreasing a power consumption. Then, in a control device and a data storage device of the present invention, there would thus be demand for suppressing increase of memory area. Moreover in a control device and a data storage device of the present invention, there would thus be demand for increasing in read out speed of data. Then, in a data processing apparatus of the present invention, there would thus be demand for increasing in read out speed of data.

CONFIGURATION TO SOLVE THE PROGRAM

The present invention accomplishes at least part of the demand mentioned above and the other relevant demands by the following configurations applied to the data processing apparatus, the control device and the data storage device.

According to one aspect, the present invention is directed to a data processing apparatus configured to process data. The data processing apparatus has: a first memory configured to be a dynamic random access memory; a second memory configured to be a nonvolatile random access memory storing data; and a control processing unit configured to control the first memory to store write data to write in the first memory when the write data is high rewritten data having much number of rewrite times and to control the second memory to store the write data in the second memory when the write data is not the high rewritten data.

In the data processing apparatus according to this aspect of the invention, the data processing apparatus controls the first memory to store write data to write in the first memory when the write data is high rewritten data having much number of rewrite times. The first memory is configured to be as a dynamic random access memory. Therefore, refresh operation is needed to be performed periodically. The data processing apparatus controls the first memory to store write data in the first memory when the write data is high rewritten data.

Thus, compared to a data processing apparatus controlling the first memory to store write data whether the write data is high rewritten data or not, frequent rewriting of data in the first memory is accomplished. Thus decrease of number of refresh operation times in the first memory and decrease of power consumption is accomplished. The data processing apparatus also controls the second memory to store the write data when the write data is not the high rewritten data. The second memory is configured to be a nonvolatile random access memory. Therefore, the more the write time is, the severer the deterioration of the second memory is. When the write data is not the high rewritten data, controlling the second memory to store the write data enables to decrease the number of the rewrite times in the second memory and enables to suppress the deterioration of the second memory. Thus decreasing the deterioration of the second memory and the power consumption is accomplished. In the data processing apparatus according to this aspect of the invention, the 'nonvolatile random access memory' includes any one of a resistance random access memory, a ferroelectric random access memory, a magnetoresistive random access memory, and a phase change memory.

In the data processing apparatus according to this aspect of the invention, the control processing unit has: a first control unit configured to control the first memory to store the write data in the first memory when the write data is the high rewritten data and to output the write data and a second memory write request signal requesting to write data in the second memory when the write data is not the high rewritten data; and a second control unit configured to control the second memory to store the input data when the second memory write request signal is input.

In the data processing apparatus according to this aspect of the invention having the first control unit and the second control unit, the first control unit of the control processing unit is configured to output the second memory write request signal, the write data and information of logical address when the write data is not the high rewritten data. The second control unit of the control processing unit has: a volatile memory unit configured to be a volatile random access memory; a conversion table memory unit configured to generate and store an address conversion table when the second memory write request signal is input, the address conversion table being showing relation between the information of the logical address and information of a physical address in the second memory in converting the input information of the logical address into information of the physical address to rewrite data in an area of a storage area capable of storing data in the second memory, the area of the storage area capable of storing data having comparatively less number of the rewrite times; and a memory control unit configured to control the second memory to read out the stored address conversion table, convert the input information of the logical address into the information of the physical address using the read address conversion table, and control the second memory to store the write data in an area of the second memory equivalent to the converted information of the physical address when the second memory write request signal is input and the input write data has size of equal to or more than predefined size, and to control the volatile memory unit to store the write data in an area of the volatile memory unit equivalent to the input logical address even as the second memory write request signal is input when the input write data has size of less than predefined size. In general, the smaller the size of the write data is, the larger the storage area needed to store the address conversion table tends to be. This data processing apparatus controls the second memory to read out the stored address conversion table, converts the input information of the logical address into the information of the physical address using the read address conversion table, and controls the second memory to store the write data in an area of the second memory equivalent to the converted information of the physical address when the second memory write request signal is input and the input write data has size of equal to or more than predefined size. This data processing apparatus also controls the volatile memory unit to store the write data in an area of the volatile memory unit equivalent to the input logical address even as the second memory write request signal is input when the input write data has size of less than predefined size. Thus, compared to a data processing apparatus converting the logic address information into the physical address information by the address conversion table for all write data regardless of size of the input write data, decrease of an area stored the address conversion table is accomplished.

In the data processing apparatus according to this aspect of the invention having the first control unit and the second control unit, reading out the stored address conversion table, and converting the input information of the logical address into the information of the physical address using the read address conversion table when the input write data has size of equal to or more than predefined size, the second control unit of the control processing unit further has a timer unit measuring the length of elapsed time since the write data having size of less than the predefined size is input. The memory control unit reads out data stored in the volatile memory unit and controls the second memory to store the read data when the input data from the first control unit has size of equal to or more than the predefined size before the length of elapsed time exceeds the predefined time. The data stored in the volatile memory unit disappears on the unexpected stop of power supply to the data processing unit. The memory control unit reads out data stored in the volatile memory unit and controls the second memory to store the read data in the second memory when the input data from the first control unit has size of equal to or more than the predefined size before the length of elapsed time exceeds the predefined time. Thus data stored in the volatile memory unit is evacuated to the second memory, and proper coping with the unexpected stop of power supply to the data processing unit is accomplished. In the data processing apparatus according to this aspect of the invention, the 'volatile random access memory' includes any one of a dynamic random access memory, a static random access memory and so on.

In the data processing apparatus according to this aspect of the invention having the first control unit and the second control unit, the data processing apparatus further has: a nonvolatile storage device configured to be as a nonvolatile type storage device; and a fourth memory configured to be as nonvolatile random access memory. The first control unit of the control processing unit outputs storage device write request signal and the write data to the second control unit when writing data in the nonvolatile storage device is requested, outputs storage device readout request signal to the second control unit when reading out data from the nonvolatile storage device is requested, and outputs second memory readout request signal to the second control when reading out data from the second memory is requested. The second control unit of the control processing unit has: a first encoding processing unit configured to control the nonvolatile storage device to store the input write data in the nonvolatile storage device when the storage device write request signal is input and the input write data is not high frequent access data read and written frequently, and to encode the input write data into first error correction code and control the fourth memory to store the encoded data when the storage device write request signal is input and the input write data is the high frequent access data; a second encoding processing unit configured to encode the input write data into a second error correction code correcting less bit errors than the first error correction code and control the second memory to store the encoded data when the second memory write request signal is input; a first decoding processing unit configured to control the nonvolatile storage device to read out data from the nonvolatile storage device when the storage readout request signal is input and output data to be output is not the high frequent access data, and to control the fourth memory to read out data from the fourth memory, perform error correction and decoding the read data as the first error correction code, and output the decoded data to the first control unit when the storage readout request signal is input and the output data is the high frequent access data; and a second decoding processing unit configured to control the second memory to read out data from the second memory, perform error correction and decoding the read data as the second error correction code, and output the decoded data to the first control unit when the second memory readout request signal is input. In general, the less the number of bit errors correctable by error correction code is, the shorter the processing time needed to perform decoding to data, error correction, and encoding to data by the error correction code tends to be. When the storage device write request signal is input and the input write data is the high frequent access data, the data processing apparatus encodes the input write data into first error correction code and controls the fourth memory to store the encoded data. Also when the second memory write request signal is input, the data processing apparatus encodes the input write data into a second error correction code correcting less bit errors than the first error correction code and controls the second memory to store the encoded data. This treatment enables to encode write data and to store data in the memory faster when the second memory write request signal is input. When the storage readout request signal is input and output data to be output is the high frequent access data, the data processing apparatus controls the fourth memory to read out data from the fourth memory, performs error correction and decoding the read data as the first error correction code, and outputs the decoded data to the first control unit. Then, when the second memory readout request signal is input, the data processing apparatus controls the second memory to read out data from the second memory, performs error correction and decoding to the read data as the second error correction code, and outputs the decoded data to the first control unit. This treatment enables to perform error correction and decoding to the read out data from the second memory and to output decoded data to the first control unit faster when the second memory read out request signal is input. Thus faster processing is accomplished.

In the data processing apparatus according to this aspect of the invention having the first control unit, the second control unit, the first decoding processing unit and the second decoding processing unit, the first error correction code is BCH code having first size of codeword obtained by adding parity bit to the write data and the second error correction code is BCH code having second size of codeword. The second size is shorter than the first size. In this data processing apparatus, the second memory and the fourth memory are equipped on the same semiconductor chip. In this data processing apparatus, the first memory and the control processing unit are equipped on first semiconductor chip, the second memory and the fourth memory are equipped on the second semiconductor chip different from the first semiconductor chip, the nonvolatile storage device is a flash memory equipped on third semiconductor chip different from the first semiconductor chip and the second semiconductor chip, three chips of the first semiconductor chip, the second semiconductor chip and the third semiconductor chip are stacked, and the three chips are electrically connected with each other by conductor metal electrodes filled in a plurality of via holes formed in each chips. In this data processing apparatus, the nonvolatile device is a hard disk drive.

In the data processing apparatus according to this aspect of the invention having the first control unit and the second control unit, the first control unit of the control processing unit reads out data stored in the first memory, outputs the second memory write request signal, outputs the read data as write data to the second control unit, then cuts off power supply from external power supply to the first memory, the second memory and the second control unit when stop of the data processing apparatus is requested. Compared to a data processing apparatus continuing power supply to the first memory, the second memory, and the second control unit when the stop of the data processing apparatus is requested, the data processing apparatus enables power consumption to be smaller. In this data processing apparatus, the data processing apparatus further has a third memory configured to be a volatile random access memory. In this processing apparatus, the first control unit of the control processing unit reads out data stored in the first memory and the third memory, outputs the second memory write request signal, outputs the read data as write data to the second control unit, then cuts off power supply from external power supply to the first memory, the second memory, the third memory and the second control unit when the stop of the data processing apparatus is requested. Compared to a data processing apparatus continuing power supply to the first memory, the second memory, the second control unit, and the third memory when the stop of the data processing apparatus is requested, this data processing apparatus enables power consumption to be smaller. In the data processing apparatus according to this aspect of the invention, the 'volatile random access memory' includes any one of a dynamic random access memory, and a static random access memory.

In the data processing apparatus according to this aspect of the invention, the control processing unit controls the first memory and the second memory to read out data stored in the first memory and then store the read data in the second memory, and cuts off power supply from external power supply to the first memory and the second memory after finishing storing data in the second memory when the stop of the data processing apparatus is requested. Compared to a data processing apparatus continuing power supply to the first memory and the second memory when the stop of the data processing apparatus is requested, this data processing apparatus enables power consumption to be smaller. In the data processing apparatus, the data processing apparatus further has a third memory configured to be a volatile random access memory. In this data processing apparatus, the control processing unit controls the first memory, the second memory and the third memory to read out data stored in the first memory and data stored in the third memory and then store the read data in the second memory, and cuts off power supply from external power supply to the first memory, the second memory and the third memory after finishing storing data in the third memory when the stop of the data processing apparatus is requested. Compared to a data processing apparatus continuing power supply to the first memory, the second memory, and the third memory when the stop of the data processing apparatus is requested, this data processing apparatus enables power consumption to be smaller. In the data processing apparatus according to this aspect of the invention, the 'volatile random access memory' includes any one of a dynamic random access memory, and a static random access memory.

According to another aspect, the present invention is directed to a data processing apparatus configured to process data. The data processing apparatus has: a first memory configured to be a volatile random access memory; a second memory configured to be a nonvolatile random access memory; and a control processing unit configured to control the first memory and the second memory to read out data stored in the first memory and then store the read data in the second memory, and cuts off power supply from external power supply to the first memory and the second memory after finishing storing data in the second memory when the stop of the data processing apparatus is requested.

In the data processing apparatus according to this aspect of the invention, when the stop of the data processing apparatus is requested, the data processing apparatus controls the first memory and the second memory to read out data stored in the first memory and then store the read data in the second memory, and cuts off electric power supply from external power supply to the first memory and the second memory after finishing storing data in the second memory. Compared to a data processing apparatus continuing power supply to the first memory and the second memory when the stop of the data processing apparatus is requested, this data processing apparatus enables power consumption to be smaller. In this data processing apparatus, the control processing unit has: a second memory control unit configured to control the second memory to store the input data and then output a second memory write stop signal when a second memory write request signal requesting writing data in the second memory is input; and a first memory control unit configured to read out data stored in the first memory and output the read data and the second memory write request signal to the second memory control unit when the stop of the data processing apparatus is requested, and to cut off power supply from external power supply to the first memory, the second memory and the second memory control unit when the second memory write stop signal is input. When the stop of the data processing apparatus is requested, the data processing apparatus reads out data stored in the first memory and outputs the read data and the second memory write request signal to the second memory control unit. When a second memory write request signal is input, the data processing apparatus controls the second memory to store the input data and then outputs a second memory write stop signal. When the second memory write stop signal is input, the data processing apparatus cuts off power supply from external power supply to the first memory, the second memory and the second memory control unit. This treatment enables to cut off the power supply to the first memory, the second memory and the second memory control unit when the stop of the data processing apparatus is requested. Thus the decrease of power consumption is accomplished. In the data processing apparatus according to this aspect of the invention, the 'volatile random access memory' includes any one of a dynamic random access memory, and a static random access memory. Then in the data processing apparatus according to this aspect of the invention, the 'nonvolatile random access memory' includes any one of a resistance random access memory, a ferroelectric random access memory, a magnetoresistive random access memory, and a phase change memory.

According to one aspect, the present invention is directed to a control device configured to control a nonvolatile memory configured to be as a nonvolatile random access memory to store write data input from a host sequentially in an area equivalent to information of logical address input from the host device. The control device has: a volatile memory unit configured to be a volatile random access memory; a conversion table memory unit configured to generate and store an address conversion table when write request signal requesting data input from the host device in the nonvolatile memory is input, the address conversion table being showing relation between the information of the logical address and information of a physical address in the nonvolatile memory in converting the input information of the logical address into information of the physical address to rewrite data in an area of a storage area capable of storing data in the nonvolatile memory, the area of the storage area capable of storing data having comparatively less number of the rewrite times; and a memory control unit configured to convert the input information of the logical address into the information of the physical address using the stored address conversion table and control the nonvolatile memory to store the write data in an area of the nonvolatile memory equivalent to the converted information of the physical address when the write request signal is input and the input write data has size of equal to or more than predefined size, and to control the volatile memory unit to store the write data in an area of the volatile memory unit equivalent to the input logical address even as the write request signal is input when the input write data has size of less than predefined size.

In the control device according to this aspect of the invention, this data processing apparatus converts the input information of the logical address into the information of the physical address using the stored address conversion table, and controls the nonvolatile memory to store the write data in an area of the nonvolatile memory equivalent to the converted information of the physical address when the write request signal is input and the input write data has size of equal to or more than predefined size. This data processing apparatus also controls the volatile memory unit to store the write data in an area of the volatile memory unit equivalent to the input logical address even as the write request signal is input when the input write data has size of less than predefined size. Thus, compared to a control device converting the logic address information into the physical address information by the address conversion table for all write data regardless of size of the input write data, decrease of an area stored the address conversion table is accomplished. Therefore, the suppress of increase of storage area is accomplished. In the data processing apparatus according to this aspect of the invention, the 'volatile random access memory' includes a static random access memory.

In the control device according to this aspect of the invention, the control device further has a timer unit measuring the length of elapsed time since the write data having size of less than the predefined size is input. In this control device, the memory control unit reads out data stored in the volatile memory unit and controls the nonvolatile memory to store the read data when the sequent input write data has size of equal to or more than the predefined size before the length of elapsed time exceeds the predefined time. The data stored in the volatile memory unit disappears on the unexpected stop of power supply to the control device. The control device reads out data stored in the volatile memory unit and controls the second memory to store the read data when the input data from host device has size of equal to or more than the predefined size before the length of elapsed time exceeds the predefined time. Thus data stored in the volatile memory unit is evacuated to the second memory, and proper coping with the unexpected stop of power supply to the control device is accomplished.

According to one aspect, the present invention is directed to a data storage device storing data. The data storage device has the control device in described above. The control device is configured to control a nonvolatile memory configured to be as a nonvolatile random access memory to store write data input from a host sequentially in an area equivalent to information of logical address input from the host device. The control device has: a volatile memory unit configured to be a volatile random access memory; a conversion table memory unit configured to generate and store an address conversion table when write request signal requesting data input from the host device in the nonvolatile memory is input, the address conversion table being showing relation between the information of the logical address and information of a physical address in the nonvolatile memory in converting the input information of the logical address into information of the physical address to rewrite data in an area of a storage area capable of storing data in the nonvolatile memory, the area of the storage area capable of storing data having comparatively less number of the rewrite times; and a memory control unit configured to convert the input information of the logical address into the information of the physical address using the stored address conversion table and control the nonvolatile memory to store the write data in an area of the nonvolatile memory equivalent to the converted information of the physical address when the write request signal is input and the input write data has size of equal to or more than predefined size, and to control the volatile memory unit to store the write data in an area of the volatile memory unit equivalent to the input logical address even as the write request signal is input when the input write data has size of less than predefined size. The data storage further has a first storage device configured to be as a nonvolatile storage device; and a second storage device configured to be as the volatile memory.

In the data storage according to this aspect of the invention, the first data storage has the control device according to the above aspect of the invention. The present invention accomplishes at any one part of the demand mentioned above by the following configuration applied to the first control device, for example, the demand of suppression of increase of storage area.

In the data storage according to this aspect of the invention, the first storage device is any one of flash memory or a hard disk drive, and the second storage device is any one of a resistance random access memory, a ferroelectric random access memory, a magnetoresistive random access memory, or a phase change memory.

According to another aspect, the present invention of the second data storage device is directed to a control device transferring data between a host device, a nonvolatile storage device configured to be as a nonvolatile type storage device, a first nonvolatile memory configured to be as a nonvolatile random access memory, and a second nonvolatile memory configured to be as the nonvolatile random access memory. The control device has: a first encoding processing unit configured to control the nonvolatile storage device to store the input write data from the host device when the storage device write request signal requesting writing data in the nonvolatile storage device is input from the host device and the input write data from the host device is not high frequent access data read and written frequently, and to encode the input write data into first error correction code and control the first nonvolatile memory to store the encoded data when the storage device write request signal is input from the host device and the input write data is the high frequent access data; a second encoding processing unit configured to encode the input write data into a second error correction code correcting less bit errors than the first error correction code and control the second nonvolatile memory to store the encoded data when the memory write request signal requesting writing data in the second nonvolatile memory is input from the host device; a first decoding processing unit configured to control the nonvolatile storage device to read out data from the nonvolatile storage device when the storage readout request signal requesting reading out data in the nonvolatile storage device is input from the host device and output data to be output is not the high frequent access data, and to control the first nonvolatile memory to read out data from the first nonvolatile memory, perform error correction and decoding the read data as the first error correction code, and output the decoded data to the host device when the storage readout request signal is input from the host device and the output data is the high frequent access data; and a second decoding processing unit configured to control the second nonvolatile memory to read out data from the second nonvolatile memory, perform error correction and decoding the read data as the second error correction code, and output the decoded data to the host device when memory readout request signal requesting reading out data from the second nonvolatile memory is input from the host device.

In the data storage according to this aspect of the invention, the data storage controls the nonvolatile storage device to store the input write data from the host device when the storage device write request signal requesting writing data in the nonvolatile storage device is input from the host device and the input write data from the host device is not high frequent access data read and written frequently, and encodes the input write data into first error correction code and control the first nonvolatile memory to store the encoded data when the storage device write request signal is input from the host device and the input write data is the high frequent access data. Then, the data storage encodes the input write data into a second error correction code correcting less errors than the first error correction code and controls the second nonvolatile memory to store the encoded data when the memory write request signal requesting writing data in the second nonvolatile memory is input from the host device. In general, the less the number of bit errors correctable by error correction code is, the shorter the processing time needed to perform decoding to data, error correction, and encoding to data by the error correction code tends to be. When the memory write request signal requesting writing data in the second nonvolatile memory is input from the host device, the data storage encodes the input write data into a second error correction code correcting less errors than the first error correction code and controls the second nonvolatile memory to store the encoded data. This treatment enables to encode write data faster when the second memory write request signal is input. Then, the data storage controls the nonvolatile storage device to read out data from the nonvolatile storage device when the storage readout request signal requesting reading out data in the nonvolatile storage device is input from the host device and output data to be output is not the high frequent access data, and controls the first nonvolatile memory to read out data from the first nonvolatile memory, perform error correction and decoding the read data as the first error correction code, and output the decoded data to the host device when the storage readout request signal is input from the host device and the output data is the high frequent access data. Then, the data storage controls the second nonvolatile memory to read out data from the second nonvolatile memory, perform error correction and decoding the read data as the second error correction code, and outputs the decoded data to the host device when memory readout request signal requesting reading out data from the second nonvolatile memory is input from the host device. This treatment enables to perform error correction and decoding to the read out data from the second memory and to output decoded data to the first control unit faster when the second memory read out request signal is input. Thus faster processing is accomplished.

In the second control device according to this aspect of the invention, the first error correction code is BCH code having first size of codeword obtained by adding parity bit to the write data, and the second error correction code is BCH code having second size of codeword, the second size being shorter than the first size.

According to one aspect, the present invention of the second control device is directed to a data storage device storing data. The data storage device has the control device in described above. The control device transfers data between a host device, a nonvolatile storage device configured to be as a nonvolatile type storage device, a first nonvolatile memory configured to be as a nonvolatile random access memory, and a second nonvolatile memory configured to be as the nonvolatile random access memory. The control device has: a first encoding processing unit configured to control the nonvolatile storage device to store the input write data from the host device when the storage device write request signal requesting writing data in the nonvolatile storage device is input from the host device and the input write data from the host device is not high frequent access data read and written frequently, and to encode the input write data into first error correction code and control the first nonvolatile memory to store the encoded data when the storage device write request signal is input from the host device and the input write data is the high frequent access data; a second encoding processing unit configured to encode the input write data into a second error correction code correcting less errors than the first error correction code and control the second nonvolatile memory to store the encoded data when the memory write request signal requesting writing data in the second nonvolatile memory is input from the host device; a first decoding processing unit configured to control the nonvolatile storage device to read out data from the nonvolatile storage device when the storage readout request signal requesting reading out data in the nonvolatile storage device is input from the host device and output data to be output is not the high frequent access data, and to control the first nonvolatile memory to read out data from the first nonvolatile memory, perform error correction and decoding the read data as the first error correction code, and output the decoded data to the host device when the storage readout request signal is input from the host device and the output data is the high frequent access data; and a second decoding processing unit configured to control the second nonvolatile memory to read out data from the second nonvolatile memory, perform error correction and decoding the read data as the second error correction code, and output the decoded data to the host device when memory readout request signal requesting reading out data from the second nonvolatile memory is input from the host device. The data storage device further has: a first storage device configured to be as a nonvolatile storage device; and a second storage device comprising the first nonvolatile memory and the second nonvolatile memory.

In the second data storage according to this aspect of the invention, the data storage has the control device according to the above aspect of the invention. The present invention accomplishes at any one part of the demand mentioned above by the following configuration applied to the control device, for example, the demand of faster processing.

In the second data storage according to this aspect of the invention, the first storage device is any one of flash memory and a hard disk drive, and the first nonvolatile memory and the second nonvolatile memory of the second storage device are any one of a resistance random access memory, a ferroelectric random access memory, a magnetoresistive random access memory, and a phase change memory.

According to one aspect, the present invention of the third data processing apparatus is directed to a data processing apparatus processing data. The processing apparatus has: a nonvolatile memory configured to be as a nonvolatile random access memory and store data; an information output unit configured to output reliability information including information of reliability of the nonvolatile memory; and a control processing unit configured to execute a predefined process using the output reliability information.

In the third data processing apparatus according to this aspect of the invention, the data processing apparatus executes a predefined process using the output reliability information. Thus proper execution of predefined processing using the output reliability information is accomplished.

In the third data processing apparatus according to this aspect of the invention, the reliability information includes any one of a first information, a second information, a third information, a fourth information and a fifth information, the first information being number of error bits of data stored in the nonvolatile memory, the second information being maximum value of number of rewritable times for the nonvolatile memory before predefined period passes, the third information being total of rewrite times after beginning of use of the data processing apparatus, the fourth information being number of rewritable bits in the nonvolatile memory before the predefined period passes, the fifth information being total of rewrite bits in the nonvolatile memory after the beginning of the use of the data processing apparatus.

According to another aspect, the present invention the fourth data processing apparatus is directed to a data processing apparatus processing data. The processing apparatus has: a resistance memory configured to store program; and a control processing unit configured to control the resistance memory to read out program stored therein when the readout of the program is requested.

In the fourth data processing apparatus according to this aspect of the invention, the data processing apparatus controls the resistance memory to read out program stored therein when the readout of the program is requested. In general, a resistance memory reads and writes data faster than NOR type flash memory. Therefore, storing the program in the resistance memory and controlling the resistance memory to read out program stored therein enable to readout the program at a high speed. Thus faster processing of data is accomplished.

In the fourth data processing apparatus according to this aspect of the invention, the control unit has: a first control unit configured to output program readout signal when the readout of the program is requested; and a second control unit configured to control the resistance memory to read out the program stored therein when the program readout signal is input.

BRIEF DESCRIPTION OF THE DRAWING

FIG. 6 schematically illustrates a flow chart showing a memory processing routine executed by a memory controller 40 of a SSD 30.

FIG. 7 schematically illustrates one configuration of a PC 110 that is data processing apparatus as a second embodiment.

DESCRIPTION OF THE PREFERRED EMBODIMENT

One mode of carrying out the invention is described below as a preferred embodiment.

Figure 1:
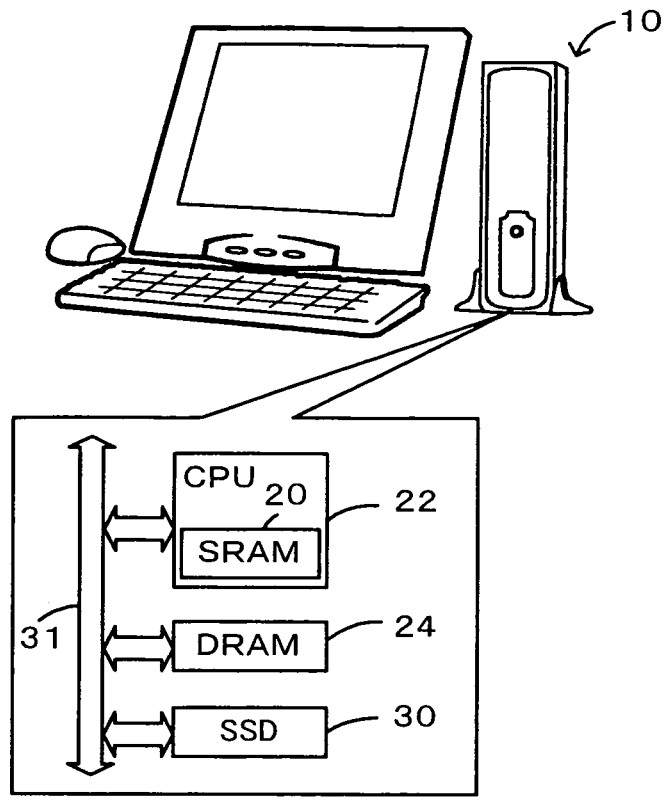
FIG. 1 schematically illustrates one configuration of a PC 10 that is a data processing apparatus as a first embodiment.
Figure 2:
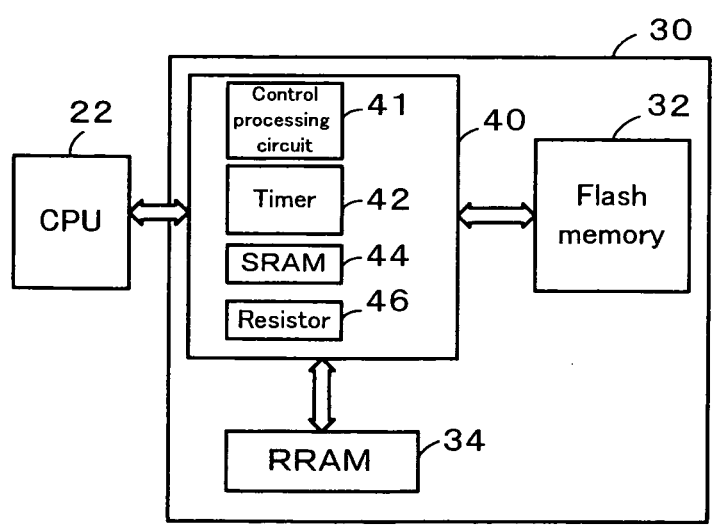
FIG. 2 schematically illustrates one configuration of a SSD (Solid State Drive) 30 mounted on the PC 10.

FIG. 1 schematically illustrates one configuration of a PC 10 that is a data processing apparatus as a first embodiment. FIG. 2 schematically illustrates one configuration of a SSD 30 mounted on the PC 10. The PC 10 is configured to be a personal computer. The PC 10 has: a CPU 22 configured to include a SRAM 20 as a cache memory and to execute arithmetic processing and control as a host device; a DRAM 24 configured to be a main memory storing data temporally; and an SSD 30 configured to be large capacity storage device storing application programs and data. The CPU 22, the DRAM 24 and the SSD 30 transfer data or signal via a bus 31 with one another.

Application programs or data files are stored in the SSD 30. The CPU 22 controls the SSD 30 and the DRAM 24 to store the application programs or data files stored in the SSD 30. Then, the CPU 22 controls the SSD 30 and the DRAM 24 to execute arithmetic processing based on the application programs stored in the DRAM 24. The CPU 22 also controls the SSD 30 and the DRAM 24 to store result of execution in the DRAM 24 and the SSD 30 as a data. The CPU 22 controls the DRAM 24 to perform refresh operation periodically reading out data stored in the DRAM 24 to write the read data in the DRAM 24.

The SSD 30 illustrated in FIG. 2 has a flash memory 32 configured as a NAND type flash memory, an RRAM 34 configured as a resistance random access memory, a memory controller 40 configured as a control device controlling the flash memory 32 and the RRAM 34.

The flash memory 32 is configured as a NAND type flash memory having a flash memory cell array (not illustrated) that has a plurality of flash memory cells having a threshold voltage varying by electrons injection into a floating gate or by drawing electrons away from the floating gate. In addition to the flash memory cell array, the flash memory 32 has a row decoder, a column decoder, a sense amplifier and so on (all not illustrated). In the flash memory 32, data is written or read out in a page (in this embodiment, one page corresponds to 8K byte), and the stored data is erased in a block (in this embodiment, one block corresponds to 1M byte).

Figure 3:
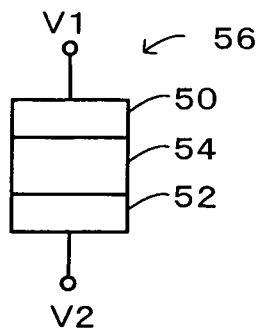
FIG. 3 schematically illustrates one configuration of a resistance random access memory 56.

The RRAM 34 is configured as an RRAM having an RRAM cell array (not illustrated) that has a plurality of RRAM cells. The RRAM cell has a resistance memory element 56 illustrated in FIG. 3 and a MOS transistor (not illustrated) connected with the resistance memory element 56. The resistance memory element 56 is configured to have a metal oxide 54 between a top electrode 50 formed by metal, for example, titanium (Ti) or platinum (Pt), and a bottom electrode 52 formed by metal, for example, titanium (Ti) or platinum (Pt). The RRAM 34 further has a row decoder, a column decoder, a sense amplifier and so on (all not illustrated). The RRAM cell is configured as an element performing a bipolar operation. In the bipolar operation, the RRAM cell is set (lowered resistance) when voltage V1 applied in the top electrode 50 is higher than voltage V2 applied in the bottom electrode 52. The RRAM cell is reset (raised resistance) when voltage V1 is lower than voltage V2. In general, the RRAM cell performing such a bipolar operation is comparatively fast operation and low power element. Therefore, the RRAM 34 is configured to be comparatively fast operation and low power element. It is considered that metal oxide, for example, titanium oxide (TiOx), nickel oxide (NiOx), copper oxide (CuOx), hafnium oxide (HfOx) or structure by stacking a polarity of the metal oxide is preferred as the metal oxide 54.

The memory controller 40 has: a control processing circuit 41 configured to be a logic circuit having a plurality of logic element; an on-chip timer circuit 42 taking time; an SRAM 44 storing data; and a resistor 46 storing data temporally. The memory controller 40 is input control signals and data from the CPU 22. The memory controller 40 controls the flash memory 32 and the RRAM 34 to store data respectively based on the input control signal. The memory controller 40 controls the flash memory 32 and the RRAM 34 to read out data respectively based on the input control signal. The memory controller 40 also outputs the read out data to the CPU 22. The memory controller 40 counts number of rewrite times with respect to storage area of the RRAM 34.

Figure 4:
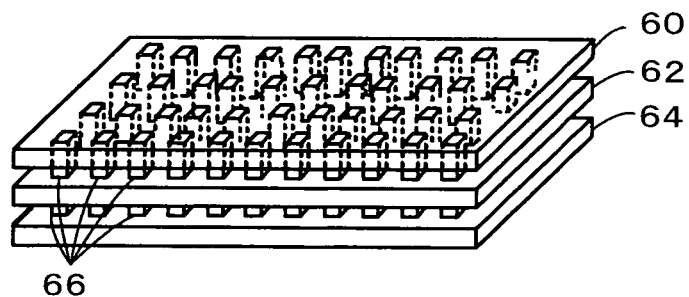
FIG. 4 schematically illustrates one configuration of structure stacked by semiconductor chips 60, 62, 64.

In the PC 10, the CPU 22, the SRAM 20, the DRAM 24 and the memory controller 40 of the SSD 30 are equipped on the same chip 60. The RRAM 34 of the SSD 30 is equipped on a chip 62 as shown in FIG. 4. The flash memory 32 is equipped on a chip 64. The semiconductor chips 60, 62 and 64 are stacked. Three semiconductor chips, i.e., the semiconductor chips 60, 62 and 64 are electrically connected with each other by conductor metal electrodes 66 like copper (Cu) filled in a plurality of via holes formed in each chips. The semiconductor chips 60, 62 and 64 transfer data, and control signals with one another via metal electrodes 66.

In the PC 10 of the embodiment, the programs stored the flash memory 32 of the SSD 30 is read into the CPU 22, the SRAM 20, the DRAM 24 and the SSD 30 are controlled to read out data from the SRAM 20, the DRAM 24 and the SSD 30 based on the read programs. Then the PC 10 performs arithmetic processing to the read data based on the programs. The PC 10 adds header information to the data that is a result of arithmetic processing. Then, the PC 10 controls the SRAM 20, the DRAM 24 and the SSD 30 to write the added data to the SRAM 20, the DRAM 24 and the SSD 30. The header information is included an information about type of data showing operation history and access frequency that is number of read and write times per second and so on.

Figure 5:
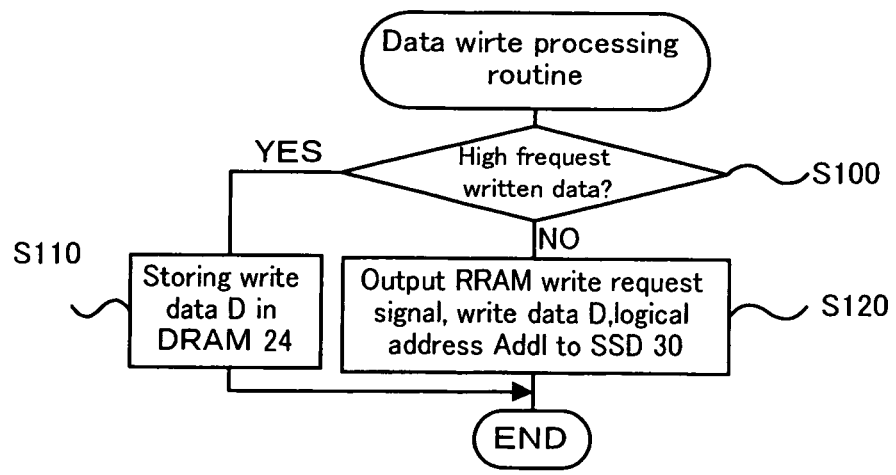
FIG. 5 schematically illustrates a flow chart showing a data write processing routine executed by a CPU 22.

Next, the operation of the PC 10 configured above, especially the operation in writing data into the DRAM 24 or the SSD 30 is described below. FIG. 5 schematically illustrates a flow chart showing a data write processing routine executed by the CPU 22. This routine is executed in temporally storing data carried out by the CPU 22 during executing the programs.

When the data write processing routine is executed, the CPU 22 checks type of write data D to be rewritten by checking the header information of the write data D (step S100). When the write data D is high rewritten data (for examples, a file written history of operation, user data of application and so on) having much number of rewrite times, the CPU 22 controls the DRAM 24 to store the write data D (step S110). Thus process enables the DRAM 24 to store the write data D when the write data D is the high rewritten data.

When the write data D is not high rewritten data, the CPU 22 outputs RRAM write request signal, the write data D and a logical address Addl of the write data D to the memory controller 40 of the SSD 30 (step S120). Then this routine is terminated. The memory controller 40 of the SSD 30 input RRAM write request signal, the write data D and a logical address Addl of the write data D executes a memory processing routine illustrated in FIG. 6. The explanation of the data write processing routine illustrated in FIG. 5 is broken off, and the explanation of operation of the memory controller 40 is described below.

When the memory processing routine is executed, the control processing circuit 41 of the memory controller 40 inputs the logical address Addl and the write data D from the CPU 22 (step S200). The control processing circuit 41 compares elapse time T to reference time Tref (step S210). The elapse time T is the time from when the write data D having less size than the reference size Sref is input till when the write data D having less size than the reference size Sref is input next time. The elapse time T is used to be counted by the on-chip timer 42. The reference time Tref is predefined time (for examples, 10 ms, 50 ms, 100 ms and so on). The predefined time is set to evacuate data stored in the SRAM 44 to the RRAM 34 preparing for unexpected stop of power. So the process of the step S210 is estimation whether data stored in the SRAM 44 is to be evacuated to the RRAM 34 or not.

When the elapse time T is less than the reference time Tref (step S210), the control circuit 41 estimates that data stored in the SRAM 44 is not needed to be evacuated to the RRAM 34. Then the control circuit 41 compares data size S of the input value (for examples, 512K byte, 1M byte, 1.5M byte and so on) is used as the reference size Sref. The predefined value is the upper limit of data size that the increase in the memory area for address conversion table for ware leveling is not ignored because of the increase in the size of the address conversion table for the ware leveling. In addition, the ware leveling is a method of leveling number of the rewrite times per one memory cell, and the address conversion table for ware leveling is used for inverting the logical address Addl of the write data D to physical address Addl in the ware leveling. In general, the smaller the size of the write data D is, the bigger the size of address conversion table is. This is the reason for setting the reference size described above. Therefore, the process of the step S220 is estimation whether the ware leveling is to be executed or not.

When the data size Sd is equal to or more than the reference size Sref (step S220), the control circuit 41 estimates that the execution of the ware leveling and storing the write data D in the RRAM 34 are allowed. Then the control circuit 41 generates address conversion table and controls the resistor 46 of the memory controller 40 to store the address conversion table (step S230). The address conversion table is for converting logical address to physical address so as not to concentrate on rewriting of data in the same storage area using the number of the rewrite times per storage area of the RRAM 34. Then the control circuit 41 converts the logical address to the physical address using the stored address conversion table and controls the RRAM 34 to store the write data in storage area of the RRAM 34 equivalent to the converted physical address (step S240). Then this routine is terminated. When the data size of the write data D is equal to or more than the reference size Sref, the control circuit 41 executes the ware leveling and controls the RRAM 34 to store the write data D. Thus the rewrite times of each storage area of the RRAM 34 are leveled, and the suppression of the deterioration of the RRAM 34 is accomplished.

When the data size Sd is less than the reference size Sref (step S220), the control circuit 41 estimates that the execution of the ware leveling is not allowed and storing the write data D in the RRAM 34 is not allowed. Then the control circuit 41 controls the SRAM 44 to store the write data D (step S250), and this routine is terminated. As described above, the smaller the size of the write data D is, the bigger the size of address conversion table tends to be. Compared to a PC generating address conversion table for ware leveling and performing ware leveling using an address conversion table despite of the size of the write data, the PC 10 accomplishes the suppression of the data storage area for the ware leveling by controlling the SRAM 44 to store the write data D when the data size Sd is less than the reference size Sref.

When the elapse time T is equal to or more than the reference time Tref (step S210), the control circuit 41 estimates that the data size Sd of the write data input sequentially for specified period is equal to and more than the reference size Sref and new data is not written in the SRAM 44. Therefore, the control circuit 41 estimates that data stored in the SRAM 44 is needed to be evacuated to the RRAM 34 prepared for unexpected stop of power supply, for example, blackout. Then the control circuit 41 controls the RRAM 34 to store data stored in the SRAM 44 (step S260), and this routine is terminated. Thus the suppression of disappear of data stored in the SRAM 44 is accomplished. The operation of the memory controller 40 of the SSD 30 input the RRAM write request signal, the write data D and the logical address Addl of the write data D is described above.

The data write processing routine illustrated in FIG. 5 is described below again. As described above, in the data write processing routine illustrated in FIG. 5, when the write data D is the high rewritten data, the CPU 22 controls the DRAM 24 to store the write data D (steps S100 and S110). When the write data D is not the high rewritten data, the CPU 22 controls the RRAM 34 of the SSD 30 or the SRAM 44 to store the write data D (steps S100 and S120). In general, refresh operation periodically (for example, per μ seconds) reading out data from the DRAM and rewriting the read data in the DRAM is needed to be performed. When the write data D is the high rewritten data, the CPU 22 controls the DRAM 24 to store the write data D. This treatment enables data stored in the DRAM 24 to be rewritten frequently. Therefore, compared to an apparatus controlling a DRAM to store the write data D regardless of a type of the write data D, the PC 10 enables intervals of the refresh operations of the DRAM 24 to be longer. Therefore, the decrease of power consumption is accomplished. In general, the more the number of the rewrite times for the same storage area of RRAM is, the more the deterioration of the RRAM is. When the write data D is not the high rewritten data, the PC 10 controls the RRAM 34 of the SSD 30 or the SRAM 44 to store the write data D. The PC 10 enables the number of the rewrite times of the RRAM 34 to be smaller and enables the deterioration of the RRAM 34 to be smaller. Therefore, the decrease of power consumption is accomplished with the deterioration of the RRAM 34 suppressed.

In the PC 10 of the first embodiment, when the write data D is the high rewritten data, the PC 10 controls the DRAM 24 to store the write data D. When the write data D is not the high rewritten data, the PC 10 controls the RRAM 34 of the SSD 30 or the SRAM 44 to store the write data D. Thus the decrease of power consumption is accomplished with the deterioration of the RRAM 34 suppressed. In controlling the RRAM 34 of the SRAM 44 to store the write data D, when the elapse time T is less than the reference time T and the data size Sd is equal to or more than the reference size Sref, the PC 10 generates address conversion table for the ware leveling, controls the resistor 46 of the memory controller 40 to store the address conversion table, converts the logical address to the physical address using the stored address conversion table, and controls the RRAM 34 to store the write data in storage area of the RRAM 34 equivalent to the converted physical address. Compared to a PC generating address conversion table for the ware leveling and performing the ware leveling using an address conversion table despite of the size of the write data, more suppression of the data storage area for the ware leveling is accomplished. Moreover, when the elapse time T is equal to or more than the reference time T, the PC 10 controls the RRAM 34 to store data stored in the SRAM 44. Thus the suppression of disappear of data stored in the SRAM 44 is accomplished.

In the PC 10 of the first embodiment, when the elapse time T is equal to or more than the reference time Tref, the PC 10 is set to control the RRAM 34 to store data stored in the SRAM 44 in the steps S210 and S260. The processes of steps S210 and S260 are allowed not to be executed. In this case, the execution of processes of step S200 and steps from S220 to S250 is allowed.

In the PC 10 of the first embodiment, the memory controller 40 is set to include the SRAM 44. The memory controller 40 is allowed to include another volatile random access memory that does not maintain data during the stop of power supply, for examples, DRAM and so on, instead of the SRAM 44.

In the PC 10 of the first embodiment, the SSD 30 is set to have the flash memory 32. The SSD 30 is allowed to have other nonvolatile memory storage, for example, hard disk drive and so on, instead of the flash memory 22.

In the PC 10 of the first embodiment, the PC 10 is set to have the RRAM cell of RRAM34 configured as an element performing a bipolar operation. The RRAM cell is allowed to be configured as an element having the resistance memory element 56 and a diode (not illustrated) and performing a unipolar operation. In the unipolar operation, the RRAM cell is "set" (lowered resistance) when voltage V1 is higher than voltage V2. The RRAM cell is "reset" (raised resistance) when voltage V1 is higher than voltage V2 and lower than a voltage supplied for the RRAM cell to be set. In general, the RRAM cell performing such a unipolar operation is configured to have smaller cell size and simpler configuration than the RRAM cell performing such a bipolar operation. Thus smaller area of the RRAM cell is accomplished.

In the PC 10 of the first embodiment, the PC 10 is set to have the RRAM 34. The SSD 30 is allowed to have other nonvolatile random access memory, for example, a ferroelectric random access memory having a capacitor with a ferroelectric material sandwiched by two electrodes, a magnetoresistive random access memory having a MTJ (Magneto Tunnel Junction) element structured by sandwiching a magnetoresistive film by magnetic films, or a phase change random access memory having an element structured by sandwiching a phase change material by two electrodes.

In the PC 10 of the first embodiment, the RRAM 34 is set to be equipped on the semiconductor chip 64. The RRAM 34 is allowed to be divided into a plurality of RRAMs. In this case, the divided RRAMs are allowed to be equipped on the different chips respectively.

In the PC 10 of the first embodiment, the CPU 22, the SRAM 20, the DRAM 24 and the memory controller 40 of the SSD 30 are equipped on the same semiconductor chip 60. The CPU 22, the SRAM 20, the DRAM 24 and the memory controller 40 of the SSD 30 are allowed to be equipped on the different semiconductor chips respectively.

In the PC 10 of the first embodiment, three chips or the semiconductor chips 60, 62 and 64 are set to be stacked and to be electrically connected by a plurality of the metal electrode 66. The semiconductor chips 60, 62 and 64 are allowed to be molded inside resin package and be put on one circuit board or a plurality of circuit board.

In the first embodiment, the present invention is adapted to the personal computer. The present invention is adapted to the data processing apparatus to process data, for example, a cellular phone, a digital still camera, a digital video camera and so on.

The primary elements in the embodiment and its modified examples are mapped to the primary constituents in the claims of the invention as described below. In the first data processing apparatus of the present invention, the DRAM 22 is equivalent to the 'first memory'. The RRAM 34 is equivalent to the 'second memory'. The combination of the CPU 22 and the memory controller 40 is equivalent to the 'control processing unit'. In the first control device of the present invention, the CPU 22 is equivalent to the 'host device'. The SRAM 44 is equivalent to the 'volatile memory unit'. The combination of the control circuit 41 and the resistor of the memory controller 40 executing process of generating the address conversion table for the ware leveling to store the generated address conversion table in the resistor 46 is equivalent to the 'conversion table unit'. The combination of the control processing circuit 41 executing process of controlling the RRAM 34 and the SRAM 44 to store the write data D in the RRAM34 or the SRAM44 based on the size of the data D is equivalent to the 'memory control unit'. In the first data processing apparatus of the present invention, the flash memory 32 is equivalent to the 'first storage device'. The RRAM 34 is equivalent to the 'second storage device'.

Figure 8:
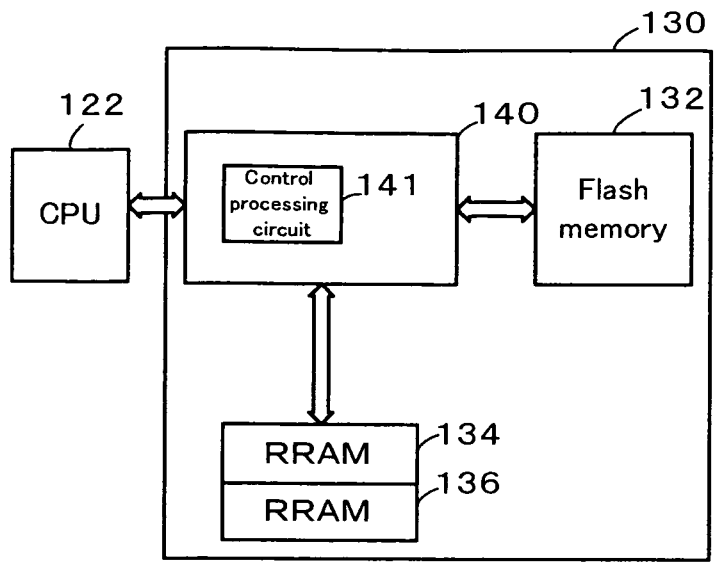
FIG. 8 schematically illustrates one configuration of a SSD 130 mounted on the PC 110.

FIG. 7 schematically illustrates one configuration of a PC 110 that is a data processing apparatus as a second embodiment. FIG. 8 schematically illustrates one configuration of a SSD 130 mounted on the PC 110. The PC 110 is configured to be a personal computer. The PC 110 has: a CPU122 configured to include a SRAM 120 as a cache memory and to execute arithmetic processing and control as a host device; a DRAM 124 configured to be a main memory storing data temporally; and an SSD 130 configured to be large capacity storage device storing application programs and data. The CPU 122, the DRAM 124 and the SSD 130 transfer data or signal via a bus 131 with one another.

Application programs or data files are stored in the SSD 130. The CPU 122 controls the SSD 130 and the DRAM 124 to store the application programs or data files stored in the SSD 130. Then, the CPU 122 controls the SSD 130 and the DRAM 124 to execute arithmetic processing based on the application programs stored in the DRAM 124. The CPU 122 also controls the SSD 130 and the DRAM 124 to store result of execution in the DRAM 124 and the SSD 130 as a data. The CPU 122 controls the DRAM 124 to perform refresh operation periodically reading out data stored in the DRAM 124 to write the read data in the DRAM 124.

The SSD 130 illustrated in FIG. 8 has a flash memory 132 configured as a NAND type flash memory, RRAMs 134 and 136 configured as a resistance random access memory, a memory controller 140 configured as a control device controlling the flash memory 132 and the RRAMs 134 and 136.

The flash memory 132 is configured as a NAND type flash memory having a flash memory cell array (not illustrated) that has a plurality of flash memory cells having a threshold voltage varying by electrons injection into a floating gate or by drawing electrons away from the floating gate. In addition to the flash memory cell array, the flash memory 132 has a low decoder, a column decoder, a sense amplifier and so on (all not illustrated). In the flash memory 132, data is written or read out in a page (in this embodiment, one page corresponds to 8K byte), and the stored data is erased in a block (in this embodiment, one block corresponds to 1M byte).

Figure 9:
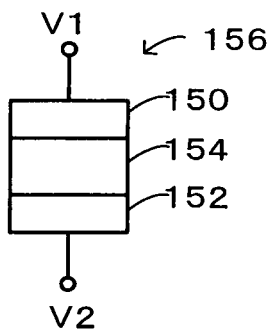
FIG. 9 schematically illustrates one configuration of a resistance random access memory 156.
Figure 10:
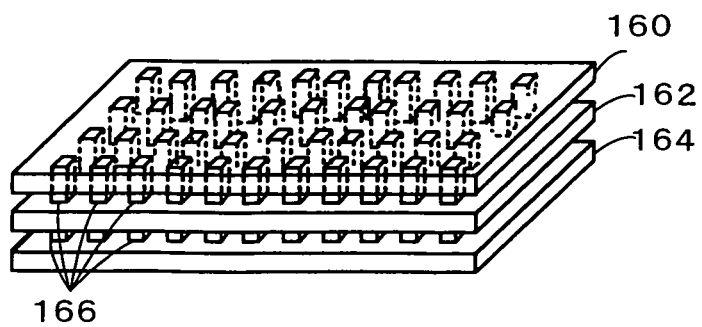
FIG. 10 schematically illustrates one configuration of structure stacked by semiconductor chips 160, 162, 164.

The RRAM 134 is configured as an RRAM having an RRAM cell array (not illustrated) that has a plurality of RRAM cells. The RRAM cell has a resistance memory element 156 illustrated in FIG. 9 and a MOS transistor (not illustrated) connected with the resistance memory element 156. The resistance memory element 156 is configured to have a metal oxide 154 between a top electrode 150 formed by metal, for example, titanium (Ti) or platinum (Pt), and a bottom electrode 152 formed by metal, for example, titanium (Ti) or platinum (Pt). The RRAM 134 further has a row decoder, a column decoder, a sense amplifier and so on (all not illustrated). The RRAM cell is configured as an element performing a bipolar operation. In the bipolar operation, the RRAM cell is set (lowered resistance) when voltage V1 applied in the top electrode 150 is higher than voltage V2 applied in the bottom electrode 152. The RRAM cell is reset (raised resistance) when voltage V1 is lower than voltage V2. In general, the RRAM cell performing such a bipolar operation is comparatively fast operation and low power element. Therefore, the RRAM 134 is configured to be comparatively fast operation and low power element. It is considered that metal oxide, for example, titanium oxide (TiOx), nickel oxide (NiOx), copper oxide (CuOx), hafnium oxide (HfOx) or structure by stacking a polarity of the metal oxide is preferred as the metal oxide 154.

The memory controller 140 has a control processing circuit 41 configured to be a logic circuit having a plurality of logic element. The memory controller 140 is input control signals and data from the CPU 122. The memory controller 140 controls the flash memory 132 and the RRAMs 134 and 136 to store data respectively based on the input control signal. The memory controller 140 controls the flash memory 132 and the RRAMs 134 and 136 to read out data respectively based on the input control signal. The memory controller 140 also outputs the read out data to the CPU 122. The memory controller 140 counts number of rewrite times with respect to storage area of the RRAMs 134 and 136.

In the PC 110, the CPU 122, the SRAM 120, the DRAM 124 and the memory controller 140 of the SSD 130 are equipped on the same chip 160. The RRAM 134 of the SSD 130 is equipped on a chip 162. The flash memory 132 is equipped on a chip 164. The semiconductor chips 160, 162 and 164 are stacked. Three semiconductor chips, i.e., the semiconductor chips 160, 162 and 164 are electrically connected with each other by conductor metal electrodes 166 like copper (Cu) filled in a plurality of via holes formed in each chips. The semiconductor chips 160, 162 and 164 transfer data, and control signals with one another via metal electrodes 166.

In the PC 110 of the embodiment, the programs stored the flash memory 132 of the SSD 130 is read into the CPU 122. The SRAM 120, the DRAM 124 and the SSD 130 are controlled to read out data from the SRAM 120, the DRAM 24 and the SSD 130 based on the read programs. Then the PC 110 performs arithmetic processing to the read data based on the programs. Then, the PC 110 controls the SRAM 120, the DRAM 124 and the SSD 130 to write the write data to the SRAM 120, the DRAM 124 and the SSD 130 as a result of arithmetic processing.

Figure 11:
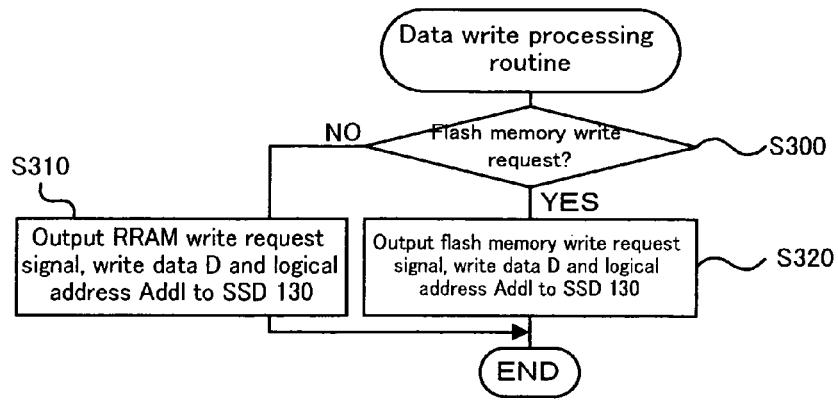
FIG. 11 schematically illustrates a flow chart showing a data write processing routine executed by a CPU 122.

Next, the operation of the PC 110 configured above, especially the operation in writing data into the SSD 130 is described below. FIG. 11 schematically illustrates a flow chart showing a data write processing routine executed by the CPU 122. This routine is executed when a write request requesting to write data carried out operation by the CPU 122 in the SSD 130 is performed.

When the data write processing routine is executed, the CPU 122 determines whether the write request is a request for writing data in the RRAM 134 or in the flash memory 132 (step S300). The write request for writing data in the RRAM 134 is set to be performed when write data D is high written data having much number of rewrite times during storing data temporally, for example, during executing programs. The write request for writing data in the flash memory 132 is set to be performed when data is needed to be stored for a long time, for example, when the program is terminated.

When the write request is the request for writing data in the RRAM 134, the CPU 122 outputs RRAM write request signal, the write data D and a logical address Addl of the write data D operated by the CPU 122 to the SSD 130 (step S310). When the write request is the request for writing data in the flash memory 132, the CPU 122 outputs flash memory write request signal, the write data D and a logical address Addl of the write data D operated by the CPU 122 to the SSD 130 (step S320). Then this routine is terminated.

Figure 12:
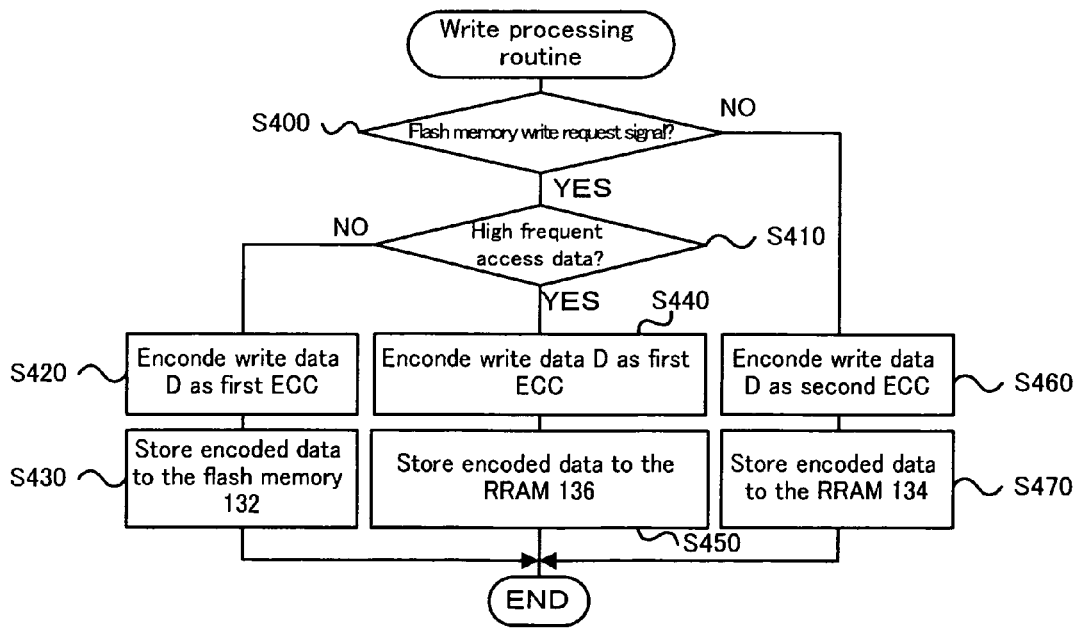
FIG. 12 schematically illustrates a flow chart showing a write processing routine executed by a control processing circuit 141 in a memory controller 140 of a SSD 130.

Next, the operation of the SSD 130 input the write request is described below. FIG. 12 schematically illustrates a flow chart showing a write processing routine executed by the control processing circuit 141 in the memory controller 140 of the SSD 130. This routine is executed when the RRAM write request signal or the flash memory write request signal from the CPU 122 is input in the control processing circuit 141 in the memory controller 140 of the SSD 130.

When the write processing routine is executed, the control circuit 141 of the memory controller 140 checks a kind of the write request signal (step S400). When the write request signal is the flash memory write request signal, it is considered that the write data D is needed to be stored for relatively long time (for example, one year and so on). The control circuit 141 checks the header information of the write data D, and determines whether the write data D is the high frequent access data (for example, a user data for applications and so on) having high access frequency being number of times per second for writing or reading the write data D or not (step S410).

When the write data ID is not the high frequent access, the control processing circuit 141 encodes the write data D (step S420) by adding error correcting bits to the write data D such that the write data D becomes a first ECC (Error Correcting Code, for example, BCH code having 32 kB codeword obtained by adding parity bits to the write data ID). The first ECC is preset as relative strong error correcting code such that the period for storing data in the flash memory 132 or the RRAM 136 is about one year. Then the control processing circuit 141 controls the flash memory 132 to store the encoded data in the memory area of the flash memory 132 corresponding to the logical address Addl (step S430), and then this routine is terminated. When the write data D is the high frequent access, the control processing circuit 141 encodes the write data D to the first ECC (step S440), controls the RRAM 136 to store the encoded data in the memory area of the RRAM 136 corresponding to the logical address Addl (step S450), and then this routine is terminated. This treatment enables the write data D encoded to the first ECC to be stored in the RRAM 136 when the write data D is high frequent access data. In general, access time in the RRAM that is a time for reading or writing (access) data is one-tenth of that of in the flash memory. By storing the high frequent access data D in the high speed memory described above, the higher speed for access is accomplished. By encoding the write data D to the first ECC that is relatively strong ECC, longer time of storing the write data D is accomplished.

When the write request signal is the RRAM write request signal (step S400), it is considered that the write data D is not needed to be stored for a long time. The control processing circuit 141 encodes the write data D (step S460) by adding error correcting bits to the write data D such that the write data D becomes a second ECC (for example, BCH code having 2 kB codeword). The second ECC is preset as relative weak ECC such that the second ECC detects less error bits than the first ECC and the period for storing data in the RRAM 134 is about one day. Then the control processing circuit 141 controls the RRAM 134 to store the encoded data in the memory area of the RRAM 134 corresponding to the logical address Addl (step S470), and then this routine is terminated. In general, in ECC, the number of error bits being able to be detected is less, the size of the error correcting bits to be added to the write data D is smaller and the processing speed in encoding the write data D is higher. Therefore, the control processing circuit 141 encodes write data D to the second ECC and controls the RRAM 134 to store the encoded data. This treatment accomplishes to encode the write data D at higher speed than when the write data D is encoded using the first ECC, and to control the RRAM 134 to store the encoded data.

Figure 13:
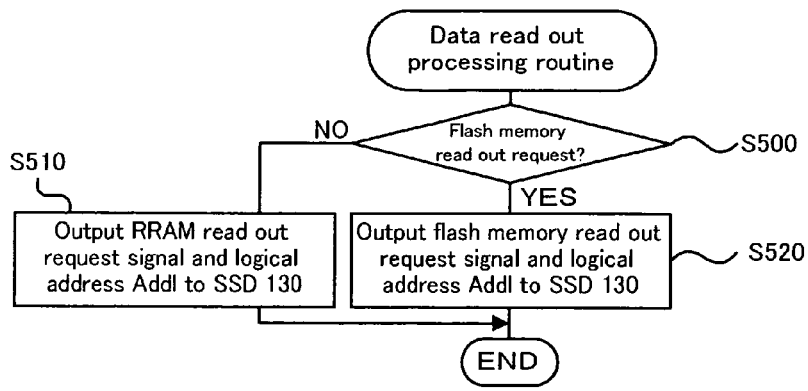
FIG. 13 schematically illustrates a flow chart showing a data read out processing routine executed by the CPU 122.

Next, the operation of PC 110 in reading out data from the SSD 130 is described below. FIG. 13 schematically illustrates a flow chart showing a data read out processing routine executed by the CPU 122. This routine is executed when the CPU 122 output the read out request requesting for reading out of data stored in the SSD 130.

When the data read out processing routine is executed, the CPU 122 determines whether the read out request is a request for reading out data from the RRAM 134 or from the flash memory 132 (step S500). The read out request for reading out data from the RRAM 134 is set to be performed when data temporally stored in the RRAM 134 is needed to be read out, i.e., the write data D is high written data having much number of rewrite times and is stored in the RRAM 134 during executing programs. For example, the read request for reading out data in the flash memory 132 is set to be performed when a selected data (file) stored in the flash memory 132 and selected by user is read out after booting a program.

When the read out request is the request for reading data from the RRAM 134, the CPU 122 outputs RRAM read out request signal and a logical address Addl of data to be read out to the SSD 130 (step S510). When the read out request is the request for reading out data from the flash memory 132, the CPU 122 outputs flash memory read out request signal and a logical address Addl of data to be read out to the SSD 130 (step S520). Then this routine is terminated.

Figure 14:
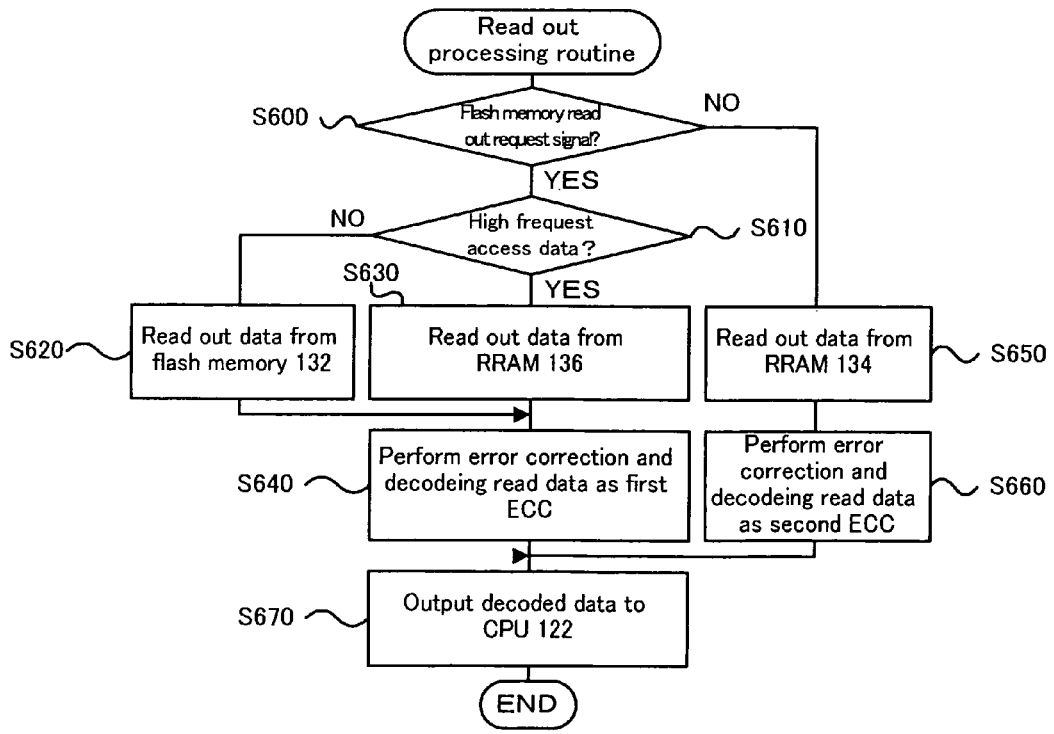
FIG. 14 schematically illustrates a flow chart showing a read out processing routine executed by a control processing circuit 141 in the memory controller 140 of the SSD 130.

Next, the operation of the SSD 130 input the read out request is described below. FIG. 14 schematically illustrates a flow chart showing a read out processing routine executed by the control processing circuit 141 in the memory controller 140 of the SSD 130. This routine is executed when the RRAM read out request signal or the flash memory read out request signal from the CPU 122 is input in the control processing circuit 141 in the memory controller 140 of the SSD 130.

When the read out processing routine is executed, the control circuit 141 of the memory controller 140 checks a kind of the read out request signal (step S600). When the read out request signal is the flash memory read out request signal, the control circuit 141 determines whether data to be read out is the high frequent access data or not based on the input logical address Addl (step S610). In this step, the control circuit 141 determines that the data to be read out is the high frequent access data when the input logical address Add indicates memory area in the RRAM 136.

When the data to be read out is not the high frequent access, the control processing circuit 141 read out data stored in the memory area of the flash memory 132 corresponding to the input logical address Addl (step S620), perform error correction and decoding to the read out data using the first ECC (step S640) and outputs decoded data to the CPU 122 (step S670). When the data to be read out is the high frequent access, the control processing circuit 141 read out data stored in the memory area of the flash memory 132 corresponding to the input logical address Addl (step S630), perform error correction and decoding to the read out data using the first ECC (step S640) and outputs decoded data to the CPU 122 (step S670). Then, this process is terminated. When error occurs in the stored data in the flash memory 132 or the RRAM 136, this process is able to correct the generated error and outputs data to the CPU 122. The suppression of generation of data error is accomplished.

When the read out request signal is not the flash memory read out request, that is, the read out request signal is the RRAM read out request, the control processing circuit 141 read out data stored in the memory area of the RRAM 134 corresponding to the input logical address Addl (step S650), perform error correction and decoding to the read out data using the second ECC (step S660) and outputs decoded data to the CPU 122 (step S670). Then this process is terminated. When error occurs in the stored data in the RRAM 134, this process is able to correct the generated error and to output data to the CPU 122. The suppression of generation of data error is accomplished. In general, in ECC, the number of error bits being able to be detected is less, the size of the error correcting bits to be added to the write data D is smaller and the processing speed in encoding the write data D is higher. Therefore, the control processing circuit 141 encodes write data D to the second ECC and controls the RRAM 134 to store the encoded data. This treatment accomplishes to decode the write data D at higher speed than when the write data D is corrected error and decoded using the first ECC, and to output the decoded data to the CPU 122. Thus a large increase in speed of reading out and writing data to the RRAM 134 of the SSD 130 is accomplished. The second ECC, however, is able to correct less error and weaker error correction than the first ECC. Therefore, compared using the first ECC, the possibility of generation of the error in data read out from RRAM 134 is higher. The weaker error correction is allowed to be used because data stored in the RRAM 134 is not needed to be hold.

In the PC 110 of the second embodiment, when the RRAM write request is performed, the PC 110 encodes the write data D to the second ECC that is able to correct less error bits than the first ECC used for storing data in the RRAM 134, and controls the RRAM 134 to store the encoded data. This treatment accomplishes to control the RRAM 134 to store the write data D higher. Also when the RRAM read out request is performed, the PC 110 performs error correction and decoding the read out data as the second ECC, and outputs the encoded data to the CPU 122 the read out data from the RRAM 134 at higher speed is accomplished. Thus a large increase in speed of reading out and writing data to the RRAM 134 is accomplished.

In the PC 110 of the second embodiment, the first ECC is set to be BCH code having 32 kB codeword and the second ECC is set to be BCH code having 2 kB codeword. Any codeword is allowed if the second ECC is able to correct less error bit than the first ECC. The first and second ECC are not restricted to BCH code. The first and second ECC are allowed to be block code, for example Reed-Solomon code, or convolutional code, for example, LDPC code.

In the PC 110 of the second embodiment, the SSD 130 is set to have the flash memory 132. The SSD 130 is allowed to have other nonvolatile memory device, for example, a hard disk drive and so on. In this case, the SSD 130 control the hard disk drive to store the write data D from CPU 122 without encoding as the first ECC instead of the steps S420 and S430 of the write processing routine illustrated in FIG. 12.

In the PC 110 of the second embodiment, the SSD 130 is set to have the RRAMs 134 and 136. The SSD 130 is allowed to have other nonvolatile random access memory, instead of the RRAMs 134 and 136, for example, a ferroelectric random access memory having a capacitor with a ferroelectric material sandwiched by two electrodes, a magnetoresistive random access memory having a MTJ element structured by sandwiching a magnetoresistive film by magnetic films, or a phase change random access memory having an element structured by sandwiching a phase change material by two electrodes.

In the PC 110 of the second embodiment, the RRAM 136 is set to have the RRAM cell configured as an element performing a bipolar operation. The RRAM cell is allowed to be configured as an element having the resistance memory element 56 and a diode (not illustrated) and performing a unipolar operation. In the unipolar operation, the RRAM cell is "set" (lowered resistance) when voltage V1 is higher than voltage V2. The RRAM cell is "reset" (raised resistance) when voltage V1 is higher than voltage V2 and lower than a voltage supplied for the RRAM cell to be set. In general, the RRAM cell performing such a unipolar operation is configured to have smaller cell size and simpler configuration than the RRAM cell performing such a bipolar operation. Thus smaller area of the RRAM 136 is accomplished. Also the RRAMs 134 and 136 are allowed to have the RRAM cell configured as an element performing a unipolar operation. Thus smaller area of the RRAM cell is accomplished.

In the PC 110 of the second embodiment, the RRAMs 134 and 136 are set to be equipped on the same semiconductor chip. The RRAMs 134 and 136 are allowed to be equipped on different semiconductor chips respectively.

In the PC 110 of the second embodiment, the CPU 122, the SRAM 120, the DRAM 124 and the memory controller 140 of the SSD 130 are equipped on the same semiconductor chip 160. The CPU 122, the SRAM 120, the DRAM 124 and the memory controller 140 of the SSD 130 are allowed to be equipped on the different semiconductor chips respectively.

In the PC 110 of the second embodiment, three chips or the semiconductor chips 160, 162 and 164 are set to be stacked and to be electrically connected by a plurality of the metal electrode 66. The semiconductor chips 160, 162 and 164 are allowed to be molded inside resin package and be put on one circuit board or a plurality of circuit board.

In the second embodiment, the present invention is adapted to the personal computer. The present invention is adapted to the data processing apparatus to process data, for example, a cellular phone, a digital still camera, a digital video camera and so on.

The primary elements in the second embodiment and its modified examples are mapped to the primary constituents in the claims of the invention as described below. In the first data processing apparatus of the present invention, the DRAM 124 is equivalent to the 'first memory'. The RRAM 134 is equivalent to the 'second memory'. The combination of the CPU 122 and the memory controller 140 is equivalent to the 'control processing unit'. In the second control device of the present invention, the CPU 122 is equivalent to the 'host device'. The SRAM 44 is equivalent to the 'volatile memory unit'. The combination of the control circuit 141 of the memory controller 140 executing process of controlling the flash memory 132 to store the write data D when the flash memory write request signal is input and the write data D input from the CPU 122 is not the high access data, and executing process of encoding the write data D to the first ECC and controlling the RRAM 136 to store the encoded data when the write data D is the high access data s equivalent to the 'first encoding processing unit'. The control processing circuit 141 executing process of encoding the write data D to the second ECC and controlling the RRAM 134 to store the encoded data when the RRAM write request signal is input is equivalent to the 'second encoding processing unit'. The control processing circuit 141 executing process of controlling the flash memory 132 to read out data, executing process of controlling the RRAM 136 to read out data from the RRAM 136 and performing error correction and decoding the read data as the first ECC, and executing process of outputting the decoded data to the CPU 122 when the flash memory read out request signal is input and data to be output is not the high frequent access data is equivalent to the 'first decoding processing unit'. The control processing circuit 141 executing process of controlling the RRAM 134 to read out data, executing process of controlling the RRAM 134 to read out data from the RRAM 134 and performing error correction and decoding the read data as the second ECC, and executing process of outputting the decoded data to the CPU 122 when data to be output is the high frequent access data is equivalent to the 'second decoding processing unit'. In the second data storage device, the flash memory 132 is equivalent to the 'first storage device' and the combination of the RRAM 134 and the RRAM 136 is equivalent to the 'second storage device'.

Figure 15:
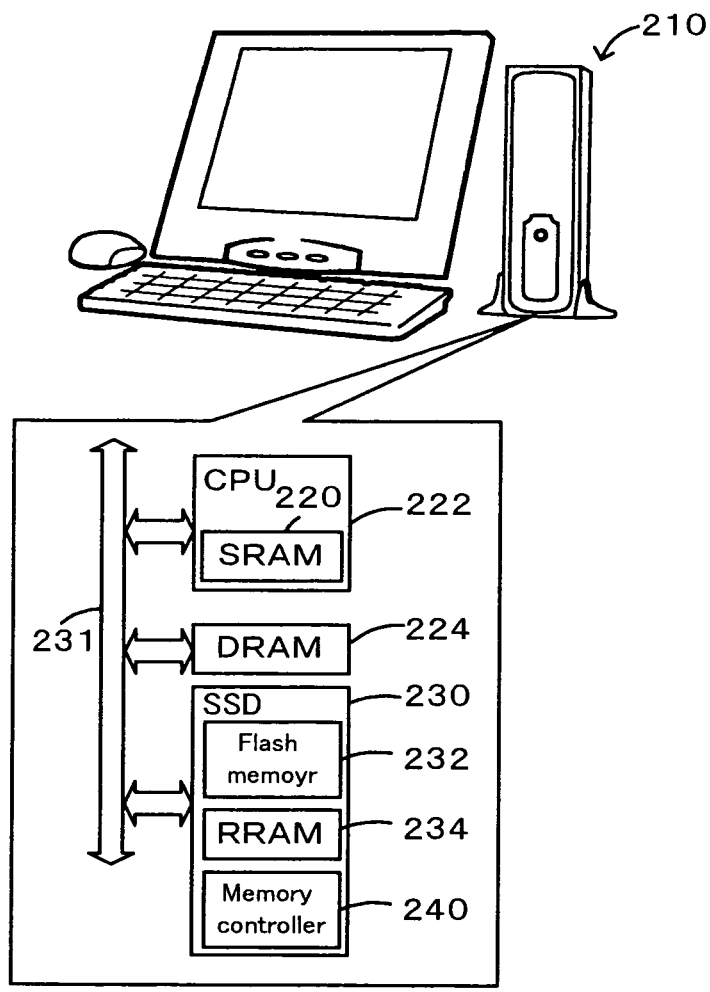
FIG. 15 schematically illustrates one configuration of a PC 210 that is data processing apparatus as a third embodiment.

FIG. 15 schematically illustrates one configuration of a PC 210 that is a data processing apparatus as a third embodiment. The PC 210 is configured to be a personal computer. The PC 210 has: a CPU 222 configured to include a SRAM 220 as a cache memory and to execute arithmetic processing and control as a host device; a DRAM 224 configured to be a main memory storing data temporally; and an SSD (Solid State Drive) 230 configured to be large capacity storage device storing application programs and data. The CPU 222, the DRAM 224 and the SSD 230 transfer data or signal via a bus 231 with one another.

Application programs or data files are stored in the SSD 230. The CPU 222 controls the SSD 230 and the DRAM 224 to store the application programs or data files stored in the SSD 230. Then, the CPU 222 controls the SSD 230 and the DRAM 224 to execute arithmetic processing based on the application programs stored in the DRAM 224. The CPU 222 also controls the SSD 230 and the DRAM 224 to store result of execution in the DRAM 224 and the SSD 230 as a data. The CPU 222 controls the DRAM 224 to perform refresh operation periodically reading out data stored in the DRAM 224 to write the read data in the DRAM 224. The CPU 222 is also able to stop power supply from an external power source to the SRAM 220, the DRAM 224, and the SSD 230.

The SSD 230 has a flash memory 232 configured as a NAND type flash memory, an RRAM 234 configured as a resistance random access memory, a memory controller 240 configured as a control device controlling the flash memory and the RRAM 234.

The flash memory 232 is configured as a NAND type flash memory having a flash memory cell array (not illustrated) that has a plurality of flash memory cells having a threshold voltage varying by electrons injection into a floating gate or by drawing electrons away from the floating gate. In addition to the flash memory cell array, the flash memory 232 has a row decoder, a column decoder, a sense amplifier and so on (all not illustrated). In the flash memory 232, data is written or read out in a page (in this embodiment, one page corresponds to 8K byte), and the stored data is erased in a block (in this embodiment, one block corresponds to 1M byte).

Figure 16:
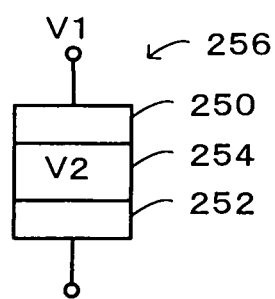
FIG. 16 schematically illustrates one configuration of a resistance random access memory 256.

The RRAM 234 is configured as an RRAM having an RRAM cell array (not illustrated) that has a plurality of RRAM cells. The RRAM cell has a resistance memory element 56 illustrated in FIG. 16 and a MOS transistor (not illustrated) connected with the resistance memory element 56. The resistance memory element 56 is configured to have a metal oxide 254 between a top electrode 250 formed by metal, for example, titanium (Ti) or platinum (Pt), and a bottom electrode 252 formed by metal, for example, titanium (Ti) or platinum (Pt). The RRAM 234 further has a row decoder, a column decoder, a sense amplifier and so on (all not illustrated). The RRAM cell is configured as an element performing a bipolar operation. In the bipolar operation, the RRAM cell is set (lowered resistance) when voltage V1 applied in the top electrode 250 is higher than voltage V2 applied in the bottom electrode 252. The RRAM cell is reset (raised resistance) when voltage V1 is lower than voltage V2. In general, the RRAM cell performing such a bipolar operation is comparatively fast operation and low power element. Therefore, the RRAM 234 is configured to be comparatively fast operation and low power element. It is considered that metal oxide, for example, titanium oxide (TiOx), nickel oxide (NiOx), copper oxide (CuOx), hafnium oxide (HfOx) or structure by stacking a polarity of the metal oxide is preferred as the metal oxide 254.

The memory controller 240 is configured to be a logic circuit having a plurality of logic element. The memory controller 240 is input control signals and data from the CPU 222. The memory controller 240 controls the flash memory 232 and the RRAM 234 to store data respectively based on the input control signal. The memory controller 240 controls the flash memory 232 and the RRAM 234 to read out data respectively based on the input control signal. The memory controller 240 also outputs the read out data to the CPU 222. The memory controller 240 counts number of rewrite times with respect to storage area of the RRAM 234.

Figure 17:
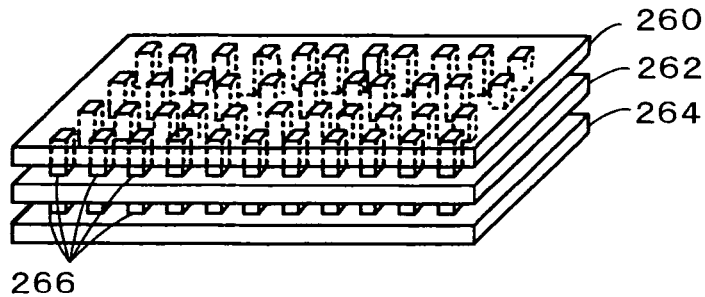
FIG. 17 schematically illustrates one configuration of structure stacked by semiconductor chips 260, 262, 264.

In the PC 210, the CPU 222, the SRAM 220, the DRAM 224 and the memory controller 420 of the SSD 320 are equipped on the same chip 260 as shown in FIG. 17. The RRAM 234 of the SSD 230 is equipped on a chip 262. The flash memory 232 is equipped on a chip 264. The semiconductor chips 260, 262 and 264 are stacked. Three semiconductor chips, i.e., the semiconductor chips 260, 262 and 264 are electrically connected with each other by conductor metal electrodes 260 like copper (Cu) filled in a plurality of via holes formed in each chips. The semiconductor chips 260, 262 and 264 transfer data, and control signals with one another via metal electrodes 266.

In the PC 210 of the embodiment, the programs stored the flash memory 232 of the SSD 230 is read into the CPU 222, the SRAM 220, the DRAM 224 and the SSD 230 are controlled to read out data from the SRAM 220, the DRAM 224 and the SSD 230 based on the read programs. Then the PC 210 performs arithmetic processing to the read data based on the programs, and adds header information to the data that is a result of arithmetic processing. The PC 210 controls the SRAM 220, the DRAM 224 and the SSD 230 to write the added data to the SRAM 220, the DRAM 224 and the SSD 230. The header information is included an information about type of data showing operation history and access frequency that is number of read and write times per second and so on.

Figure 18:
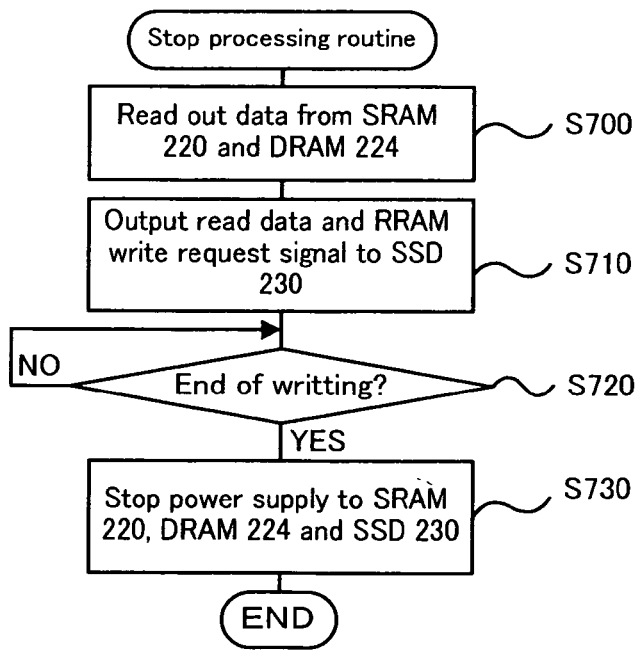
FIG. 18 schematically illustrates a flow chart showing a stop processing routine executed by a CPU 222.

Next, the operation of the PC 210 configured above, especially the operation in stopping data processing apparatus is described below. FIG. 18 schematically illustrates a flow chart showing a stop processing routine executed by the CPU 222. This routine is executed when stop of the data processing apparatus is requested.

When the stop processing routine is executed, the CPU 222 controls the SRAM 220 and the DRAM 224 to read out data (step S700), outputs the read data and RRAM write request signal to the SSD 230 (step S710), and waiting for write end signal output when the storing of data from the memory controller 240 of the SSD 230 is ended (step S720). The description of the stop processing routine is stopped. The processing executed by the memory controller 240 of the SSD 230 input the RRAM write request signal is described below.

Figure 19:
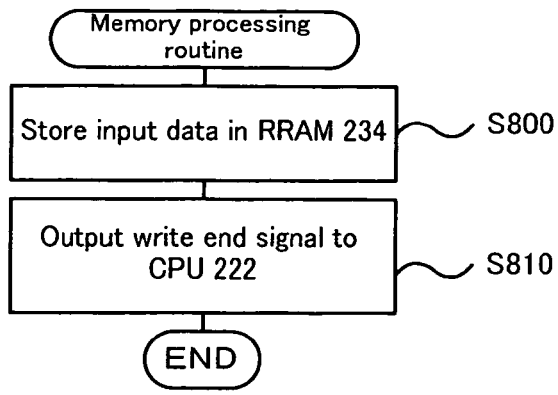
FIG. 19 schematically illustrates a flow chart showing a memory processing routine executed by a memory controller 240 of a SSD 230.

FIG. 19 schematically illustrates a flow chart showing a memory processing routine executed by the memory controller 240 of the SSD 230. This routine is executed when the RRAM write request signal is input in the memory controller 240 of the SSD 230. When the memory processing routine is executed, the memory controller 240 controls the RRAM 234 to store the input data (step S800). The memory controller 240 outputs writes end signal to the CPU 222 after the end of control of storing data in the RRAM 234 (step S810), and then this routine is terminated. This process enables the RRAM 234 to store the input data. The processing executed by the memory controller 240 of the SSD 230 input the RRAM write request signal is finished.

The description of the stop processing routine illustrated FIG. 18 is started again. When the write end signal is input (step S720), the CPU 222 estimates the end of save data stored the SRAM 220 and the DRAM 224 to the RRAM 234. Then power supply to the SRAM 220, the DRAM 224, and the SSD 230 is stopped (step S730), and this routine is terminated. The RRAM 234 of the SSD 230 is able to hold the data stored wherein when the power supply is stopped. When the stop request of the data processing apparatus is performed, data stored in the SRAM 220 and the DRAM 224 is stored in the RRAM 234, and then the power supply to the SRAM 220, DRAM 224, and SSD 230 is stopped. The decrease of power consumption with data stored in the RRAM 234 is accomplished. In the RRAM 234, however, access time for reading out and writing data is relatively short. Therefore, when the data processing apparatus stopped is started up, data stored in the RRAM 234 is quickly read out to the SRAM 220 and the DRAM 224, and the data processing apparatus is started up quickly.

In the PC 210 of the third embodiment, when the stop request of the data processing apparatus is performed, data stored in the SRAM 220 and the DRAM 224 is stored in the RRAM 234, and then the power supply to the SRAM 220, the DRAM 224, and the SSD 230 is stopped. The decrease of power consumption is accomplished.

In the PC 210 of the third embodiment, the PC 210 is set to read out data from the SRAM 220 and the DRAM 224, and to store the read data to the RRAM 234 of the SSD 230. The PC 210 is allowed to read out any one of data from the SRAM 220 and the DRAM 224, and to store the read data to the RRAM 234 of the SSD 230. The PC 210 is also allowed to read out all data stored in the SRAM 220 and the DRAM 224, and to store the read data to the RRAM 234 of the SSD 230. Then, the PC 210 is also allowed to read out a part of data stored in the SRAM 220 and the DRAM 224, and to store the read data to the RRAM 234 of the SSD 230.

In the PC 210 of the third embodiment, the memory controller 240 is set to control the RRAM 234 to store the input data in step S800. The memory controller 240 is allowed to encode the input data to error correction code, for example, BCH code, or to control the RRAM 234 to store the input data performing ware leveling that is method of leveling number of rewrite times per one memory cell.

In the PC 210 of the third embodiment, the SSD 230 is set to have the flash memory 232. The SSD 230 is allowed to have other nonvolatile memory storage, for example, hard disk drive and so on, instead of the flash memory 232.

In the PC 210 of the third embodiment, the PC 210 is set to have the RRAM cell configured as an element performing a bipolar operation. The RRAM cell is allowed to be configured as an element having the resistance memory element 56 and a diode (not illustrated) and performing a unipolar operation. In the unipolar operation, the RRAM cell is "set" (lowered resistance) when voltage V1 is higher than voltage V2. The RRAM cell is "reset" (raised resistance) when voltage V1 is higher than voltage V2 and lower than a voltage supplied for the RRAM cell to be set. In general, the RRAM cell performing such a unipolar operation is configured to have smaller cell size and simpler configuration than the RRAM cell performing such a bipolar operation. Thus smaller area of the RRAM cell is accomplished.

In the PC 210 of the third embodiment, the PC 210 is set to have the RRAM 234. The SSD 230 is allowed to have other nonvolatile random access memory, for example, a ferroelectric random access memory having a capacitor with a ferroelectric material sandwiched by two electrodes, a magnetoresistive random access memory having a MTJ element structured by sandwiching a magnetoresistive film by magnetic films, or a phase change random access memory having an element structured by sandwiching a phase change material by two electrodes.

In the PC 210 of the third embodiment, the RRAM 234 is set to be equipped on the semiconductor chip 264. The RRAM 234 is allowed to be divided into a plurality of RRAMs. In this case, the divided RRAMs are allowed to be equipped on the different chips respectively.

In the PC 210 of the first embodiment, the CPU 222, the SRAM 220, the DRAM 224 and the memory controller 240 of the SSD 230 are equipped on the same semiconductor chip 260. the CPU 222, the SRAM 220, the DRAM 224 and the memory controller 240 of the SSD 230 are allowed to be equipped on the different semiconductor chips respectively.

In the PC 210 of the third embodiment, three chips or the semiconductor chips 260, 262 and 264 are set to be stacked and to be electrically connected by a plurality of the metal electrode 266. The semiconductor chips 260, 262 and 624 are allowed to be molded inside resin package and be put on one circuit board or a plurality of circuit board.

In the third embodiment, the present invention is adapted to the personal computer. The present invention is adapted to the data processing apparatus to process data, for example, a cellular phone, and so on.

The primary elements in the third embodiment and its modified examples are mapped to the primary constituents in the claims of the invention as described below. In the first data processing apparatus of the present invention, the DRAM 224 is equivalent to the 'first memory'. The RRAM 234 is equivalent to the 'second memory'. The combination of the CPU 222 and the memory controller 240 controlling the SRAM 220, the DRAM 224 and the RRAM 234 to store data stored in the SRAM 220 and the DRAM 224 to the RRAM 234 and to store data stored in the SRAM 220 and the DRAM 224 is stored in the RRAM 234 when the stop request of the data processing apparatus is performed, and stopping the power supply to the SRAM 220, DRAM 224, and SSD 230 is equivalent to the 'control processing unit'.

Figure 20:
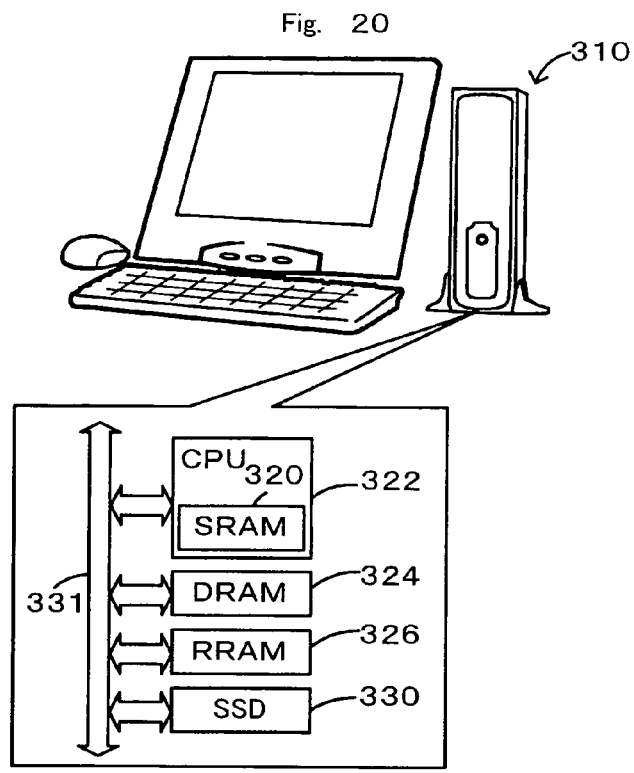
FIG. 20 schematically illustrates one configuration of a PC 310 that is a data processing apparatus as a fourth embodiment.

FIG. 20 schematically illustrates one configuration of a PC 310 that is a data processing apparatus as a fourth embodiment. The PC 310 is configured to be a personal computer. The PC 310 has: a CPU 322 configured to include a SRAM 320 as a cache memory and to execute arithmetic processing and control as a host device; a DRAM 324 configured to be a main memory storing data temporally; a RRAM 326 configured to store data; and an SSD 330 configured to be large capacity storage device storing application programs and data. The CPU 322, the DRAM 324, and RRAM 326 and the SSD 330 transfer data or signal via a bus 331 with one another.

Figure 21:
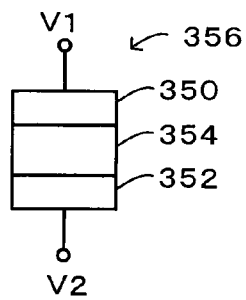
FIG. 21 schematically illustrates one configuration of a resistance random access memory 356.

The RRAM 326 is configured as an RRAM having an RRAM cell array (not illustrated) that has a plurality of RRAM cells. The RRAM cell has a resistance memory element 356 illustrated in FIG. 21 and a MOS transistor (not illustrated) connected with the resistance memory element 356. The resistance memory element 356 is configured to have a metal oxide 354 between a top electrode 350 formed by metal, for example, titanium (Ti) or platinum (Pt), and a bottom electrode 352 formed by metal, for example, titanium (Ti) or platinum (Pt). The RRAM 326 further has a row decoder, a column decoder, a sense amplifier and so on (all not illustrated). The RRAM cell is configured as an element performing a bipolar operation. In the bipolar operation, the RRAM cell is set (lowered resistance) when voltage V1 applied in the top electrode 50 is higher than voltage V2 applied in the bottom electrode 352. The RRAM cell is reset (raised resistance) when voltage V1 is lower than voltage V2. In general, the RRAM cell performing such a bipolar operation is comparatively fast operation and low power element. Therefore, the RRAM 326 is configured to be comparatively fast operation and low power element. It is considered that metal oxide, for example, titanium oxide (TiOx), nickel oxide (NiOx), copper oxide (CuOx), hafnium oxide (HfOx) or structure by stacking a polarity of the metal oxide is preferred as the metal oxide 354.

The SSD 330 is configured to nonvolatile data storage holding data when the power supply is stopped. The SSD 330 has a flash memory (not illustrated) configured as a NAND type flash memory, and a memory controller (not illustrated) configured as a control device controlling the flash memory. The SSD 330 controls the flash memory to store data input via a bus 331 and outputs data stored in the flash memory to the bus 331. Application programs and data files are stored in the flash memory of the SSD 30.

The CPU 322 controls the DRAM 324, the RRAM 326 and the SSD 330 to store the application programs or data files stored in the SSD 30. Then, the CPU 322 controls the DRAM 324, the RRAM 326 and the SSD 330 to execute arithmetic processing based on the application programs stored in the DRAM 324. The CPU 322 also controls the DRAM 324, the RRAM 326 and the SSD 330 to store result of execution in the DRAM 324, the RRAM 326 or the SSD 330. The CPU 322 controls the DRAM 324 to perform refresh operation periodically reading out data stored in the DRAM 324 to write the read data in the DRAM 324.

In the PC 310 of the embodiment, the programs stored the flash memory of the SSD 330 is read into the CPU 322, the SRAM 320, the DRAM 324 and the SSD 330 are controlled to read out data based on the read programs. Then the PC 310 performs arithmetic processing to the read data based on the programs. The PC 10 adds header information to the data that is a result of arithmetic processing. Then, the PC 310 controls the SRAM 320, the DRAM 324 and the SSD 330 to write the added data to the SRAM 320, the DRAM 324 and the SSD 330. The header information is included an information about type of data showing operation history and access frequency that is number of read and write times per second and so on.

Figure 22:
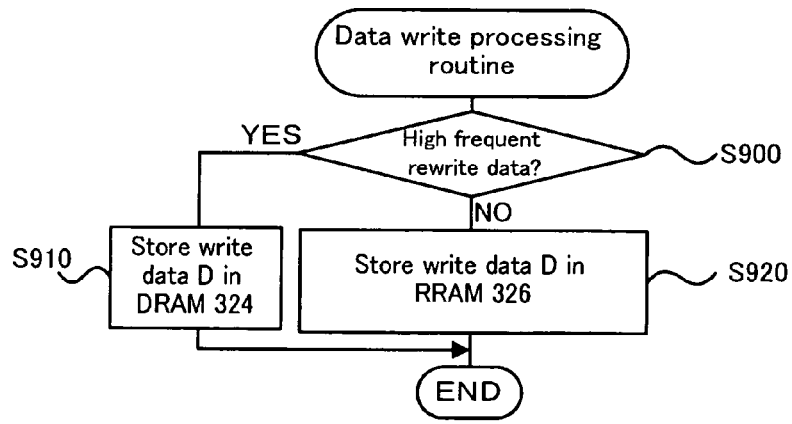
FIG. 22 schematically illustrates a flow chart showing a data write processing routine executed by a CPU 322.

Next, the operation of the PC 310 configured above, especially the operations in writing data into the DRAM 324 or the DRAM 326 and stopping the PC 310 are described below. FIG. 22 schematically illustrates a flow chart showing a data write processing routine executed by the CPU 322. This routine is executed in temporally storing data carried out by the CPU 322 during executing the programs.

When the data write processing routine is executed, the CPU 322 checks type of write data D to be rewritten by checking the header information of the write data D (step S900). When the write data D is high rewritten data (for examples, a file written history of operation, user data of application and so on) having much number of rewrite times, the CPU 322 controls the DRAM 324 to store the write data D (step S910). Thus process enables the DRAM 324 to store the write data D when the write data D is the high rewritten data.

When the write data D is not the high rewritten data, the CPU 322 controls the RRAM 326 to store the write data D (steps S920). Then, the process is terminated. In general, refresh operation periodically (for example, per μ seconds) reading out data from the DRAM and rewriting the read data in the DRAM is needed to be performed. When the write data D is the high rewritten data, the CPU 322 controls the DRAM 324 to store the write data D. This treatment enables data stored in the DRAM 324 to be rewritten frequently. Therefore, compared to an apparatus controlling a DRAM to store the write data D regardless of a type of the write data D, the PC 310 enables intervals of the refresh operations of the DRAM 324 to be longer. Therefore, the decrease of power consumption is accomplished. In general, the more the number of the rewrite times for the same storage area of RRAM is, the more the deterioration of the RRAM is. When the write data D is not the high rewritten data, the PC 310 controls the RRAM 326 to store the write data D. The PC 310 enables the number of the rewrite times of the RRAM 326 to be smaller and enables the deterioration of the RRAM 326 to be smaller. Therefore, the decrease of power consumption is accomplished with the deterioration of the RRAM 326 suppressed.

Figures 23, 24:
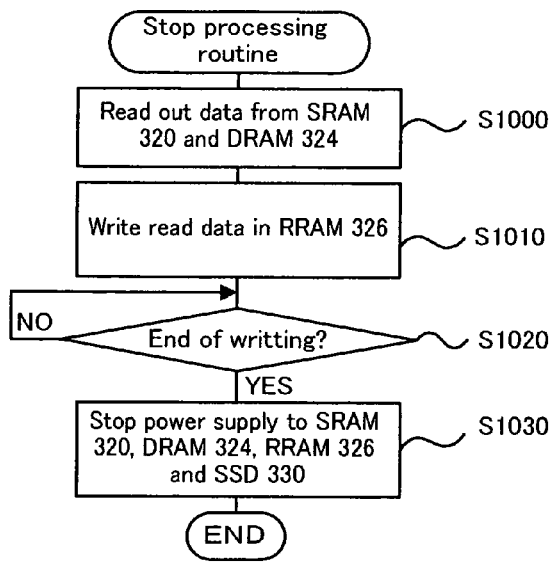
FIG. 23 schematically illustrates a flow chart showing a stop processing routine executed by the CPU 322.
FIG. 24 schematically illustrates one configuration of information of reliability output from a RRAM 326.

Next, the operation in stopping the PC 310 is described below. FIG. 23 schematically illustrates a flow chart showing the stop processing routine executed by the CPU 322. This routine is executed when stop of the data processing apparatus is requested.

When the stop processing routine is executed, the CPU 322 controls the SRAM 320 and the DRAM 324 to read out data (step S1000), controls the RRAM 326 to store the read data (step S1010), and waits until the writing of data is ended (step S1020) This process enables the RRAM 326 to store the input data.

When the writing data ends (step S1020), the CPU 322 estimates the end of save of data stored the SRAM 320 and the DRAM 324 to the RRAM 326. Then power supply to the SRAM 320, the DRAM 324, the RRAM 326 and the SSD 330 is stopped (step S1030), and this routine is terminated. The RRAM 326 of the SSD 330 is able to hold the data stored wherein when the power supply is stopped. When the stop request of the data processing apparatus performed, data stored in the SRAM 320 and the DRAM 324 is stored in the RRAM 326, and then the power supply to the SRAM 320, the DRAM 324, and the SSD 330 is stopped. The decrease of power consumption with data stored in the RRAM 326 is accomplished. In the RRAM 326, however, access time for reading out and writing data is relatively short. Therefore, when the data processing apparatus stopped is started up, data stored in the RRAM 326 is quickly read out to the SRAM 320 and the DRAM 324, and the data processing apparatus is started up quickly.

In the PC 310 of the fourth embodiment, when the write data D is the high rewritten data, the PC 310 controls the DRAM 324 to store the write data D. When the write data D is not the high rewritten data, the PC 310 controls the RRAM 326 to store the write data D. Thus the decrease of power consumption is accomplished with the deterioration of the RRAM 326 suppressed. When the stop request of the data processing apparatus is performed, data stored in the SRAM 320 and the DRAM 324 is stored in the RRAM 326, and then the power supply to the SRAM 320, the DRAM 324, and the SSD 330 is stopped. The decrease of power consumption is accomplished.

In the PC 310 of the fourth embodiment, the PC 310 is set to read out data from the SRAM 320 and the DRAM 324, and to store the read data to the RRAM 326 of the SSD 240. The PC 310 is allowed to read out any one of data from the SRAM 320 and the DRAM 324, and to store the read data to the RRAM 326 of the SSD 330. The PC 310 is also allowed to read out all data stored in the SRAM 320 and the DRAM 324, and to store the read data to the RRAM 326 of the SSD 330. Then, the PC 310 is also allowed to read out a part of data stored in the SRAM 320 and the DRAM 324, and to store the read data to the RRAM 326 of the SSD 330.

In the PC 310 of the fourth embodiment, the PC 310 is set to control the RRAM 326 to store the input data in step S1010. The PC 310 is allowed to encode the input data to error correction code, for example, BCH code, or to control the RRAM 326 to store the input data performing ware leveling that is method of leveling number of rewrite times per one memory cell.

In the PC 310 of the fourth embodiment, the CPU 322 is set to control the RRAM 326 that tends to deteriorate according the increase of the write times. The RRAM 326 is allowed to output data including information according to reliability of the RRAM 326, and the CPU 322 is allowed to perform error correction using error correcting code and this information and ware leveling that is method of leveling number of rewrite times per one memory cell. Illustrated in FIG. 24, the information according to the reliability of the RRAM 326 to be output preferable includes any one of number of bits errors occurring in data stored in the RRAM 326, maximum value of number of times that RRAM 326 is able to be rewritten from now to predefined life-span of product of the PC 310 (for example, from now for 10 years, 12 years, 14 years, and so on), totals number of rewrite times since the PC 310 is begun to be used, number of bits that RRAM 326 is able to be rewritten from now to predefined life-span of product of the PC 310 (for example, from now for 10 years, 12 years, 14 years, and so on), and totals number of bits rewritten in the RRAM 326 since the PC 310 is begun to be used.

In the PC 310 of the fourth embodiment, the SSD 330 is set to have the flash memory. The SSD 330 is allowed to have other nonvolatile memory storage, for example, hard disk drive and so on, instead of the flash memory.

In the PC 310 of the fourth embodiment, the PC 310 is set to have the RRAM cell configured as an element performing a bipolar operation. The RRAM cell is allowed to be configured as an element having the resistance memory element 356 and a diode (not illustrated) and performing a unipolar operation. In the unipolar operation, the RRAM cell is "set" (lowered resistance) when voltage V1 is higher than voltage V2. The RRAM cell is "reset" (raised resistance) when voltage V1 is higher than voltage V2 and lower than a voltage supplied for the RRAM cell to be set. In general, the RRAM cell performing such a unipolar operation is configured to have smaller cell size and simpler configuration than the RRAM cell performing such a bipolar operation. Thus smaller area of the RRAM cell is accomplished.

In the PC 310 of the fourth embodiment, the PC 310 is set to have the RRAM 326. The PC 310 is allowed to have other nonvolatile random access memory, for example, a ferroelectric random access memory having a capacitor with a ferroelectric material sandwiched by two electrodes, a magnetoresistive random access memory having a MTJ element structured by sandwiching a magnetoresistive film by magnetic films, or a phase change random access memory having an element structured by sandwiching a phase change material by two electrodes.

In the fourth embodiment, the present invention is adapted to the personal computer. The present invention is adapted to the data processing apparatus to process data, for example, a cellular phone, a digital still camera, a digital video camera and so on.

The primary elements in the fourth embodiment and its modified examples are mapped to the primary constituents in the claims of the invention as described below. In the first data processing apparatus of the present invention, the DRAM 324 is equivalent to the 'first memory'. The RRAM 326 is equivalent to the 'second memory'. The CPU 322 controlling the DRAM 324 to store the write data D when the write data D is the high rewritten data and controlling the RRAM 326 to store the write data D when the write data D is not the high rewritten data is equivalent to the 'control processing unit'. The CPU 322 controlling the SRAM 320, the DRAM 324 and the RRAM 326 to store data stored in the SRAM 320 and the DRAM 324 to the RRAM 326 when the stop request of the data processing apparatus is performed, and stopping the power supply to the SRAM 320, the DRAM 324, the RRAM 326 and SSD 330 is equivalent to the 'control processing unit'.

In the second data processing apparatus of the present invention, the DRAM 324 is equivalent to the 'first memory'. The RRAM 326 is equivalent to the 'second memory'. The CPU 322 controlling the SRAM 320, the DRAM 324 and the RRAM 326 to store data stored in the SRAM 320 and the DRAM 324 to the RRAM 326 when the stop request of the data processing apparatus is performed, and stopping the power supply to the SRAM 320, the DRAM 324, the RRAM 326 and SSD 330 is equivalent to the 'control processing unit'.

In the third data processing apparatus of the present invention, the RRAM 326 is equivalent to the 'nonvolatile memory'. The RRAM 326 outputting the information according to the reliability of the RRAM 326 is equivalent to the 'information output unit'. The CPU 322 performing error correction using the outputting reliability data is equivalent to the 'control processing unit'.

Figure 25:
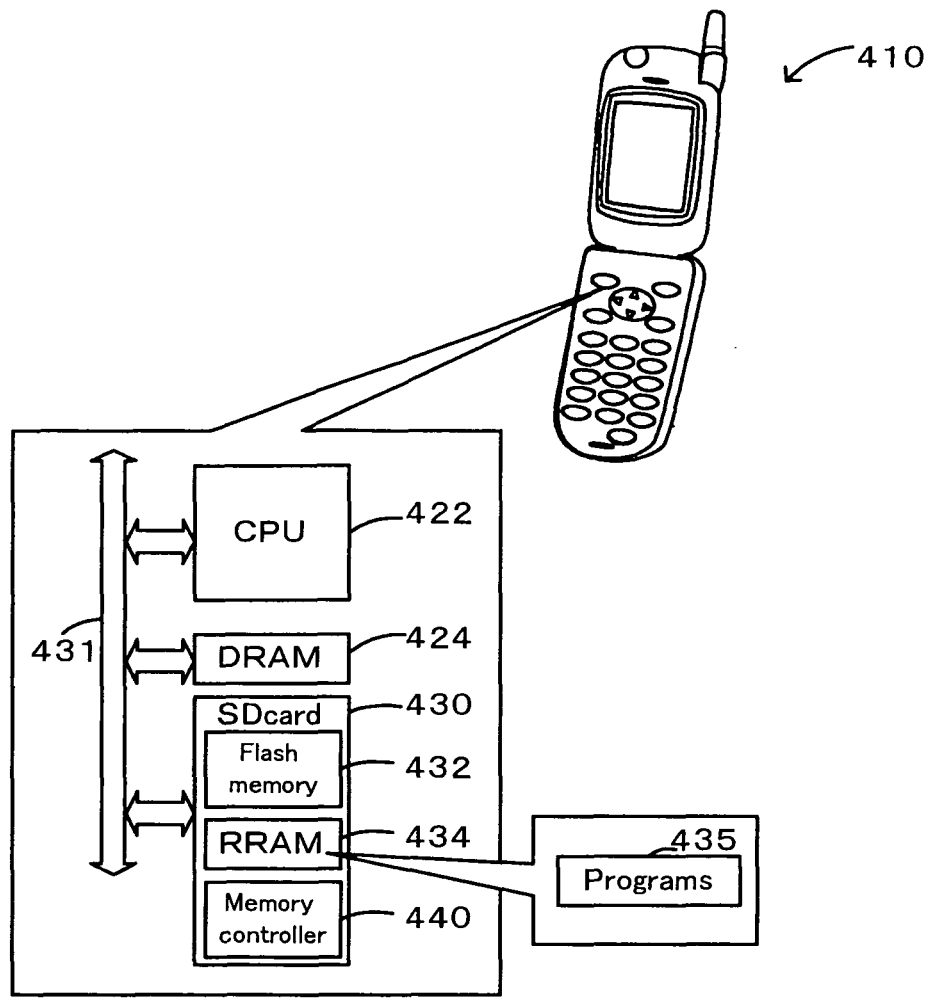
FIG. 25 schematically illustrates one configuration of a cellular phone 410 that is a data processing apparatus as a fifth embodiment.

FIG. 25 schematically illustrates one configuration of a cellular phone 410 that is a data processing apparatus as a fifth embodiment. The cellular phone 410 is configured to be a mobile terminal in mobile communication system. The cellular phone 410 has: a CPU 422 configured to execute arithmetic processing and control; a DRAM 424 configured to be a main memory storing data temporally; and an SD memory card 430 configured to be large capacity storage device storing application programs and data. The CPU 422, the DRAM 424 and the SD memory card 430 transfer data or signal via a bus 431 with one another.

The CPU 422 controls the SD memory card 430 and the DRAM 424 to store the application programs or data files stored in the SD memory card 430 to the DRAM 424. Then, the CPU 422 executes arithmetic processing based on the application programs stored in the DRAM 424. The CPU 222 also controls the SD memory card 430 and the DRAM 424 to store result of execution in the DRAM 424 and the SD memory card 430 as a data. The CPU 422 controls the DRAM 424 to perform refresh operation periodically reading out data stored in the DRAM 424 to write the read data in the DRAM 424. The CPU 422 is also able to stop power supply from an external power supply to the DRAM 424 and the SD memory card 430.

The SD memory card 430 has a flash memory 432 configured as a NAND type flash memory, an RRAM 434 configured as a resistance random access memory, a memory controller 440 configured as a control device controlling the flash memory 432 and the RRAM 434.

The flash memory 432 is configured as a NAND type flash memory having a flash memory cell array (not illustrated) that has a plurality of flash memory cells having a threshold voltage varying by electrons injection into a floating gate or by drawing electrons away from the floating gate. In addition to the flash memory cell array, the flash memory 432 has a row decoder, a column decoder, a sense amplifier and so on (all not illustrated). In the flash memory 432, data is written or read out in a page (in this embodiment, one page corresponds to 8K byte), and the stored data is erased in a block (in this embodiment, one block corresponds to 1M byte).

Figure 26:
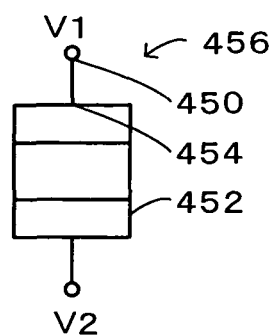
FIG. 26 schematically illustrates one configuration of a cellular phone 456 that is a data processing apparatus as a fifth embodiment.

The RRAM 434 is configured as an RRAM having an RRAM cell array (not illustrated) that has a plurality of RRAM cells. The RRAM cell has a resistance memory element 456 illustrated in FIG. 26 and a MOS transistor (not illustrated) connected with the resistance memory element 456. The resistance memory element 456 is configured to have a metal oxide 454 between a top electrode 550 formed by metal, for example, titanium (Ti) or platinum (Pt), and a bottom electrode 252 formed by metal, for example, titanium (Ti) or platinum (Pt). The RRAM 34 further has a row decoder, a column decoder, a sense amplifier and so on (all not illustrated). The RRAM cell is configured as an element performing a bipolar operation. In the bipolar operation, the RRAM cell is set (lowered resistance) when voltage V1 applied in the top electrode 450 is higher than voltage V2 applied in the bottom electrode 452. The RRAM cell is reset (raised resistance) when voltage V1 is lower than voltage V2. In general, the RRAM cell performing such a bipolar operation is comparatively fast operation and low power element. Therefore, the RRAM 434 is configured to be comparatively fast operation and low power element. It is considered that metal oxide, for example, titanium oxide (TiOx), nickel oxide (NiOx), copper oxide (CuOx), hafnium oxide (HfOx) or structure by stacking a polarity of the metal oxide is preferred as the metal oxide 454.

The memory controller 440 is configured to be a logic circuit having a plurality of logic element. The memory controller 440 is input control signals and data from the CPU 422. The memory controller 440 controls the flash memory 432 and the RRAM 434 to store data respectively based on the input control signal. The memory controller 440 controls the flash memory 432 and the RRAM 434 to read out data respectively based on the input control signal. The memory controller 440 also outputs the read out data to the CPU 422. The memory controller 440 counts number of rewrite times with respect to storage area of the RRAM 434.

In the cellular phone 410 of the embodiment, the programs, for example, application and so on, are stored in the RRAM 43 of the SD memory card 430. When user operates the cellular phone 410 and the program read out request is performed, the CPU 422 outputs the program read out signal to the SD memory card 430. The memory controller 440 of the SD memory card 430 input programs read out signal controls the RRAM 434 to read out the program stored in the RRAM 434. The CPU 422 reads the output program. After the CPU 422 reads the output program, the CPU 422 controls the DRAM 424, the SD memory card 430 and the RRAM 434 to read out data according to the read program. In general, RRAM is able to read or write data faster than flash memory does. Therefore, storing programs in the RRAM 434 enables the cellular phone 410 to read out program faster than an apparatus storing programs in the flash memory. Therefore, the increase in speed of processing data is accomplished.

In the cellular phone 410 of the fifth embodiment, the programs are stored in the RRAM 434 of the SD memory card 430. When the program read out request is performed, the CPU 422 outputs the program read out signal to the SD memory card 430. The memory controller 440 of the SD memory card 430 input program read out signal controls the RRAM 434 to read out the programs stored in the RRAM 434. Thus the increase in speed of processing data is accomplished.

In the cellular phone 410 of the fifth embodiment, the cellular phone 410 is set to have the RRAM cell of the RRAM 434 configured as an element performing a bipolar operation. The RRAM cell is allowed to be configured as an element having the resistance memory element 456 and a diode (not illustrated) and performing a unipolar operation. In the unipolar operation, the RRAM cell 434 is "set" (lowered resistance) when voltage V1 is higher than voltage V2. The RRAM cell is "reset" (raised resistance) when voltage V1 is higher than voltage V2 and lower than a voltage supplied for the RRAM cell to be set. In general, the RRAM cell performing such a unipolar operation is configured to have smaller cell size and simpler configuration than the RRAM cell performing such a bipolar operation. Thus smaller area of the RRAM cell is accomplished.

In the cellular phone 410 of the fifth embodiment, the SD memory card 430 is set to have the RRAM 434. The PC 310 is allowed to have other nonvolatile random access memory, for example, a ferroelectric random access memory having a capacitor with a ferroelectric material sandwiched by two electrodes, a magnetoresistive random access memory having a MTJ element structured by sandwiching a magnetoresistive film by magnetic films, or a phase change random access memory having an element structured by sandwiching a phase change material by two electrodes.

In the cellular phone 410 of the fifth embodiment, the SD memory card 430 is set to have the flash memory 432. The SD memory card 430 is allowed to have other nonvolatile memory storage, for example, hard disk drive and so on, instead of the flash memory.

Figure 27:
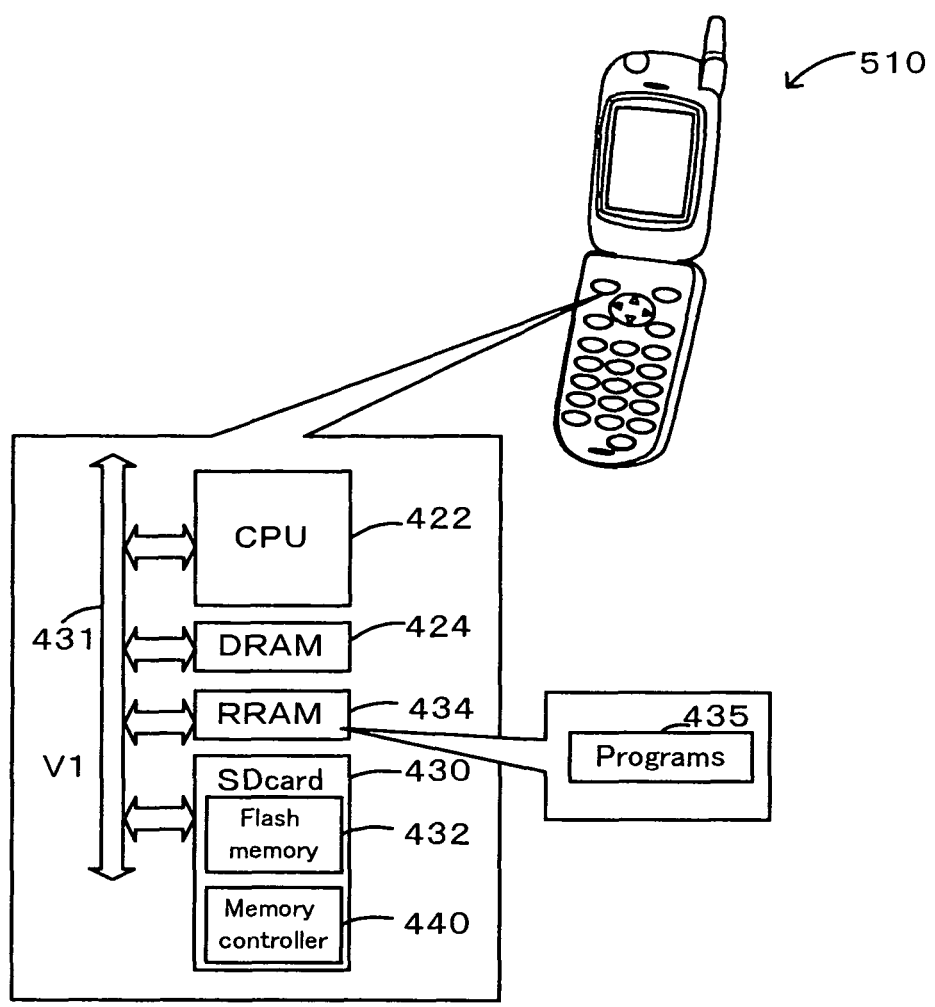
FIG. 27 schematically illustrates another configuration of a cellular phone 510.

In the cellular phone 410 of the fifth embodiment, the RRAM 434 is set to be in the SD memory card 430. As illustrated in FIG. 27 as another configuration of the cellular phone 510, the RRAM 434 is set not be in the SD memory card 430 and is controlled by the CPU 422. In this case, when the program read out request is performed, the CPU 422 preferably control the RRAM 434 to read out programs stored in the RRAM 434.

In the fifth embodiment, the present invention is adapted to the cellular phone. The present invention is adapted to the data processing apparatus to process data, for example, a digital still camera, a digital video camera, a personal computer and so on.

The primary elements in the fifth embodiment and its modified examples are mapped to the primary constituents in the claims of the invention as described below. In the fourth data processing apparatus of the present invention, the RRAM 434 is equivalent to the 'resistance memory'. The combination of the CPU 422 outputting program read out signal to the SD memory card 430 when the program read out request is performed and the memory controller of the SD memory card 430 controlling the RRAM 434 to read out programs when the program read out signal is equivalent to the 'control processing unit'.

There may be many modifications, changes, and alterations without departing from the scope or spirit of the main characteristics of the present invention. The scope and spirit of the present invention are indicated by the appended claims, rather than by the foregoing description.

The technique of the present invention is preferably applied to the manufacturing industries of data processing apparatus, control device and data storage device.

The disclose of Japanese Patent Application No. 2010-180087 filed Aug. 11, 2010 including specification, drawings and claims is incorporated herein by reference in its entirety.

What is claimed is:

1. A data processing apparatus configured to process data, the data processing apparatus comprising:
a first memory configured to be a dynamic random access memory;
a second memory configured to be a nonvolatile random access memory storing data; and
a control processing unit configured to control the first memory to store write data to write in the first memory when the write data is high rewritten data having a high number of rewrite times and to control the second memory to store the write data in the second memory when the write data is not the high rewritten data.

2. The data processing apparatus in accordance with claim 1, wherein the control processing unit comprises:
a first control unit configured to control the first memory to store the write data in the first memory when the write data is the high rewritten data and to output the write data and a second memory write request signal requesting to write data in the second memory when the write data is not the high rewritten data; and
a second control unit configured to control the second memory to store the input data when the second memory write request signal is input.

3. The data processing apparatus in accordance with claim 2, wherein the first control unit of the control processing unit is configured to output the second memory write request signal, the write data and information of logical address when the write data is not the high rewritten data, and
the second control unit of the control processing unit comprises:
a volatile memory unit configured to be a volatile random access memory different from dynamic random access memory;
a conversion table memory unit configured to generate and store an address conversion table when the second memory write request signal is input, the address conversion table being showing relation between the information of the logical address and information of a physical address in the second memory in converting the input information of the logical address into information of the physical address to rewrite data in an area of a storage area capable of storing data in the second memory, the area of the storage area capable of storing data having comparatively less number of the rewrite times; and
a memory control unit configured to control the second memory to read out the stored address conversion table, convert the input information of the logical address into the information of the physical address using the read address conversion table, and control the second memory to store the write data in an area of the second memory equivalent to the converted information of the physical address when the second memory write request signal is input and the input write data has size of equal to or more than predefined size, and to control the volatile memory unit to store the write data in an area of the volatile memory unit equivalent to the input logical address even as the second memory write request signal is input when the input write data has size of less than predefined size.

4. The data processing apparatus in accordance with claim 3, wherein the second control unit of the control processing unit further comprises a timer unit measuring the length of elapsed time since the write data having size of less than the predefined size is input, and
the memory control unit reads out data stored in the volatile memory unit and controls the second memory to store the read data when the input data from the first control unit has size of equal to or more than the predefined size before the length of elapsed time exceeds the predefined time.

5. The data processing apparatus in accordance with claim 2, the data processing apparatus further comprising:
a nonvolatile storage device configured to be as a nonvolatile type storage device; and
a fourth memory configured to be as nonvolatile random access memory,
wherein the first control unit of the control processing unit outputs storage device write request signal and the write data to the second control unit when writing data in the nonvolatile storage device is requested, outputs storage device readout request signal to the second control unit when reading out data from the nonvolatile storage device is requested, and outputs second memory readout request signal to the second control when reading out data from the second memory is requested,
the second control unit of the control processing unit comprises:
a first encoding processing unit configured to control the nonvolatile storage device to store the input write data in the nonvolatile storage device when the storage device write request signal is input and the input write data is not high frequent access data read and written frequently, and to encode the input write data into first error correction code and control the fourth memory to store the encoded data when the storage device write request signal is input and the input write data is the high frequent access data;
a second encoding processing unit configured to encode the input write data into a second error correction code correcting less errors than the first error correction code and control the second memory to store the encoded data when the second memory write request signal is input;
a first decoding processing unit configured to control the nonvolatile storage device to read out data from the nonvolatile storage device when the storage readout request signal is input and output data to be output is not the high frequent access data, and to control the fourth memory to read out data from the fourth memory, perform error correction and decoding the read data as the first error correction code, and output the decoded data to the first control unit when the storage readout request signal is input and the output data is the high frequent access data; and
a second decoding processing unit configured to control the second memory to read out data from the second memory, perform error correction and decoding the read data as the second error correction code, and output the decoded data to the first control unit when the second memory readout request signal is input.

6. The data processing apparatus in accordance with claim 5, wherein the first error correction code is Bose-Chaudhuri-Hocquenghem (BCH) code having first size of codeword obtained by adding parity bit to the write data, and the second error correction code is BCH code having second size of codeword, the second size being shorter than the first size.

7. The data processing apparatus in accordance with claim 5, wherein the second memory and the fourth memory are equipped on the same semiconductor chip.

8. The data processing apparatus in accordance with claim 5, wherein the first memory and the control processing unit are equipped on first semiconductor chip,
the second memory and the fourth memory are equipped on the second semiconductor chip different from the first semiconductor chip,
the nonvolatile storage device is a flash memory equipped on third semiconductor chip different from the first semiconductor chip and the second semiconductor chip,
three chips of the first semiconductor chip, the second semiconductor chip and the third semiconductor chip are stacked, and
the three chips are electrically connected with each other by conductor metal electrodes filled in a plurality of via holes formed in each chips.

9. The data processing apparatus in accordance with claim 5, wherein the nonvolatile device is a hard disk drive.

10. The data processing apparatus in accordance with claim 2, wherein the first control unit of the control processing unit reads out data stored in the first memory, outputs the second memory write request signal, outputs the read data as write data to the second control unit, then cuts off power supply from external power supply to the first memory, the second memory and the second control unit when stop of the data processing apparatus is requested.

11. The data processing apparatus in accordance with claim 10, the data processing apparatus further comprising a third memory configured to be a volatile random access memory different from a dynamic random access memory,
wherein the first control unit of the control processing unit reads out data stored in the first memory and the third memory, outputs the second memory write request signal, outputs the read data as write data to the second control unit, then cuts off power supply from external power supply to the first memory, the second memory, the third memory and the second control unit when the stop of the data processing apparatus is requested.

12. The data processing apparatus in accordance with claim 2, the data processing apparatus further comprising a third memory configured to be a volatile random access memory different from a dynamic random access memory,
wherein the first control unit of the control processing unit reads out data stored in the first memory and data stored in the third memory, outputs the second memory write request signal, outputs the read data as write data to the second control unit, then cuts off power supply from external power supply to the first memory, the second memory, the third memory and the second control unit when the stop of the data processing apparatus is requested.

13. The data processing apparatus in accordance with claim 2, wherein the control processing unit controls the first memory and the second memory to read out data stored in the first memory and then store the read data in the second memory, and cuts off power supply from external power supply to the first memory and the second memory after finishing storing data in the second memory when the stop of the data processing apparatus is requested.

14. The data processing apparatus in accordance with claim 13, the data processing apparatus further comprising a third memory configured to be a volatile random access memory different from a dynamic random access memory,
wherein the control processing unit controls the first memory, the second memory and the third memory to read out data stored in the first memory and data stored in the third memory and then store the read data in the second memory, and cuts off power supply from external power supply to the first memory, the second memory and the third memory after finishing storing data in the third memory when the stop of the data processing apparatus is requested.

15. The data processing apparatus in accordance with claim 4, wherein the volatile random access memory is any one of a dynamic random access memory and a static random access memory.

16. The data processing apparatus in accordance with claim 1, wherein the nonvolatile random access memory is any one of a resistance random access memory, a ferroelectric random access memory, a magnetoresistive random access memory, and a phase change memory.

17. A data processing apparatus configured to process data, the data processing apparatus comprising:
a first memory configured to be a volatile random access memory;
a second memory configured to be a nonvolatile random access memory; and
a control processing unit configured to control the first memory and the second memory to read out data stored in the first memory and then store the read data in the second memory, and cuts off power supply from external power supply to the first memory and the second memory after finishing storing data in the second memory when stop of the data processing apparatus is requested.

18. The data processing apparatus in accordance with claim 17, wherein the control processing unit comprises:
a second memory control unit configured to control the second memory to store the input data and then output a second memory write stop signal when a second memory write request signal requesting writing data in the second memory is input; and
a first memory control unit configured to read out data stored in the first memory and output the read data and the second memory write request signal to the second memory control unit when the stop of the data processing apparatus is requested, and to cut off power supply from external power supply to the first memory, the second memory and the second memory control unit when the second memory write stop signal is input.

19. The data processing apparatus in accordance with claim 17, wherein the volatile random access memory is any one of a dynamic random access memory and a static random access memory.

20. The data processing apparatus in accordance with claim 17, wherein the nonvolatile random access memory is any one of a resistance random access memory, a ferroelectric random access memory, a magnetoresistive random access memory, and a phase change memory.

21. A control device configured to control a nonvolatile memory configured to be as a nonvolatile random access memory to store write data input from a host sequentially in an area equivalent to information of logical address input from the host device, the control device comprising:
a volatile memory unit configured to be a volatile random access memory;
a conversion table memory unit configured to generate and store an address conversion table when write request signal requesting data input from the host device in the nonvolatile memory is input, the address conversion table being showing relation between the information of the logical address and information of a physical address in the nonvolatile memory in converting the input information of the logical address into information of the physical address to rewrite data in an area of a storage area capable of storing data in the nonvolatile memory, the area of the storage area capable of storing data having comparatively less number of the rewrite times; and a memory control unit configured to convert the input information of the logical address into the information of the physical address using the stored address conversion table and control the nonvolatile memory to store the write data in an area of the nonvolatile memory equivalent to the converted information of the physical address when the write request signal is input and the input write data has size of equal to or more than predefined size, and to control the volatile memory unit to store the write data in an area of the volatile memory unit equivalent to the input logical address even as the write request signal is input when the input write data has size of less than predefined size.

22. The control device in accordance with claim 21, the control device further comprising a timer unit measuring the length of elapsed time since the write data having size of less than the predefined size is input, wherein the memory control unit reads out data stored in the volatile memory unit and controls the nonvolatile memory to store the read data when the sequent input write data has size of equal to or more than the predefined size before the length of elapsed time exceeds the predefined time.

23. The control device in accordance with claim 21, wherein the volatile random access memory is a static random access memory.

24. A data storage device storing data, the data storage device comprising:
the control device in accordance with claim 21;
a first storage device configured to be as a nonvolatile storage device; and
a second storage device configured to be as the volatile memory.

25. The data storage device in accordance with claim 24, wherein the first storage device is any one of flash memory and a hard disk drive, and
the second storage device is any one of a resistance random access memory, a ferroelectric random access memory, a magnetoresistive random access memory, and a phase change memory.

26. A control device transferring data between a host device, a nonvolatile storage device configured to be as a nonvolatile type storage device, a first nonvolatile memory configured to be as a nonvolatile random access memory, and a second nonvolatile memory configured to be as the nonvolatile random access memory, the control device comprising:
a first encoding processing unit configured to control the nonvolatile storage device to store the input write data from the host device when the storage device write request signal requesting writing data in the nonvolatile storage device is input from the host device and the input write data from the host device is not high frequent access data read and written frequently, and to encode the input write data into first error correction code and control the first nonvolatile memory to store the encoded data when the storage device write request signal is input from the host device and the input write data is the high frequent access data;
a second encoding processing unit configured to encode the input write data into a second error correction code correcting less errors than the first error correction code and control the second nonvolatile memory to store the encoded data when the memory write request signal requesting writing data in the second nonvolatile memory is input from the host device;
a first decoding processing unit configured to control the nonvolatile storage device to read out data from the nonvolatile storage device when the storage readout request signal requesting reading out data in the nonvolatile storage device is input from the host device and output data to be output is not the high frequent access data, and to control the first nonvolatile memory to read out data from the first nonvolatile memory, perform error correction and decoding the read data as the first error correction code, and output the decoded data to the host device when the storage readout request signal is input from the host device and the output data is the high frequent access data; and
a second decoding processing unit configured to control the second nonvolatile memory to read out data from the second nonvolatile memory, perform error correction and decoding the read data as the second error correction code, and output the decoded data to the host device when memory readout request signal requesting reading out data from the second nonvolatile memory is input from the host device.

27. The control device in accordance with claim 26, wherein the first error correction code is Bose-Chaudhuri-Hocquenghem (BCH) code having first size of codeword obtained by adding parity bit to the write data, and
the second error correction code is BCH code having second size of codeword, the second size being shorter than the first size.

28. A data storage device storing data, the data storage device comprising:
the control device in accordance with claim 26;
a first storage device configured to be as a nonvolatile storage device; and
a second storage device comprising the first nonvolatile memory and the second nonvolatile memory.

29. The data storage device in accordance with claim 28, wherein the first storage device is any one of flash memory and a hard disk drive, and
the first nonvolatile memory and the second nonvolatile memory of the second storage device are any one of a resistance random access memory, a ferroelectric random access memory, a magnetoresistive random access memory, and a phase change memory.

30. A data processing apparatus processing data, the data processing apparatus comprising:
a nonvolatile memory configured to be as a nonvolatile random access memory and store data;
an information output unit configured to output reliability information including information of reliability of the nonvolatile memory; and
a control processing unit configured to execute a predefined process using the output reliability information.

31. The data processing apparatus in accordance with claim 30, wherein the reliability information includes any one of a first information, a second information, a third information, a fourth information and a fifth information, the first information being number of error bits of data stored in the nonvolatile memory, the second information being maximum value of number of rewritable times for the nonvolatile memory before predefined period passes, the third information being total of rewrite times after beginning of use of the data processing apparatus, the fourth information being number of rewritable bits in the nonvolatile memory before the predefined period passes, the fifth information being total of rewrite bits in the nonvolatile memory after the beginning of the use of the data processing apparatus.

* * * * *